(12) United States Patent
Pagan

(10) Patent No.: US 8,237,981 B2
(45) Date of Patent: Aug. 7, 2012

(54) HIGH-RESOLUTION PHOTOGRAPHIC PLOTTING PROCESS

(75) Inventor: Robin Pagan, Stuttgart (DE)

(73) Assignee: Miva Technologies GmbH, Schoenaich (DE)

( * ) Notice: Subject to any disclaimer, the term of this patent is extended or adjusted under 35 U.S.C. 154(b) by 798 days.

(21) Appl. No.: 12/416,917

(22) Filed: Apr. 1, 2009

(65) Prior Publication Data

US 2009/0279129 A1 Nov. 12, 2009

(30) Foreign Application Priority Data

May 6, 2008 (DE) .................. 10 2008 022 253

(51) Int. Cl.
 *G06F 15/00* (2006.01)
 *G06K 1/00* (2006.01)
 *G06K 15/12* (2006.01)

(52) U.S. Cl. .......................... 358/1.7; 358/1.1

(58) Field of Classification Search .................. None
 See application file for complete search history.

(56) References Cited

U.S. PATENT DOCUMENTS

| | | |
|---|---|---|
| 309,181 A | 12/1884 | Woodrich |
| 1,093,637 A | 4/1914 | Lint |
| 3,266,831 A | 8/1966 | Banse |
| 3,571,977 A | 3/1971 | Abeel |
| 5,217,339 A | 6/1993 | O'Connor |
| 5,426,905 A | 6/1995 | Rollhauser |
| 5,529,369 A | 6/1996 | Welborn |
| 5,655,801 A | 8/1997 | Casey |
| 5,782,511 A | 7/1998 | Schwarz |
| 6,149,210 A | 11/2000 | Hunt |
| 6,409,446 B1 | 6/2002 | Schwarz |
| 6,442,806 B1 | 9/2002 | Wesson |
| 6,443,679 B1 | 9/2002 | Schwarz |
| 6,497,436 B1 | 12/2002 | DeBlock |
| 6,679,530 B2 | 1/2004 | Krynski |
| 6,736,438 B1 | 5/2004 | Wieclawski |
| 6,837,661 B2 | 1/2005 | Schwarz |
| 6,866,227 B2 | 3/2005 | Pratt |
| 7,107,697 B2 | 9/2006 | Schwarz |
| 7,179,039 B2 | 2/2007 | Schwarz |
| 7,798,660 B2 * | 9/2010 | Itoh et al. .................. 362/19 |
| 8,115,981 B2 * | 2/2012 | Kato .................. 359/207.5 |
| 2004/0115030 A1 | 6/2004 | Schwarz |
| 2004/0240933 A1 | 12/2004 | Schwarz |
| 2007/0147975 A1 | 6/2007 | Homner |
| 2007/0158955 A1 | 7/2007 | Homner |
| 2008/0150301 A1 | 2/2008 | Homner |
| 2008/0157543 A1 | 7/2008 | Homner |
| 2008/0273922 A1 | 11/2008 | Homner |

FOREIGN PATENT DOCUMENTS

| | | |
|---|---|---|
| DE | 1860948 U | 10/1962 |
| DE | 3145155 A1 | 11/1981 |
| DE | 8710288 U1 | 10/1987 |
| DE | 3623311 A1 | 1/1988 |

(Continued)

*Primary Examiner* — Douglas Tran
(74) *Attorney, Agent, or Firm* — Woodling, Krost and Rust

(57) ABSTRACT

In a partial image, certain image dots are deflected optically in x direction with reference to imaginary undeflected image dots, and the x deflection of an image dot is less than the length of the side of an image dot. The image is traced by a light-controlling unit (preferably a semiconductor chip with tilting-mirror elements) with light-controlling elements arranged similar to a matrix. A computer program loads the light-controlling unit with a control pattern for tracing each partial image.

24 Claims, 15 Drawing Sheets

| | FOREIGN PATENT DOCUMENTS | | |
|---|---|---|---|
| DE | 3922025 C1 | 9/1990 |
| DE | 4239908 C1 | 3/1994 |
| DE | 19707634 A1 | 10/1997 |
| DE | 29808914 U1 | 9/1998 |
| DE | 29914145 U1 | 12/2000 |
| DE | 10040410 A1 | 1/2001 |
| DE | 19943083 A1 | 12/2001 |
| DE | 20218302 U1 | 3/2003 |
| DE | 10355780 A1 | 6/2005 |
| DE | 102004011183 A1 | 9/2005 |
| DE | 102006008655 A1 | 9/2006 |
| DE | 202006019165.8 | 8/2007 |
| DE | 2020070001126.6 | 8/2007 |
| EP | 0189569 B1 | 2/1989 |
| EP | 0784141 A1 | 7/1997 |
| EP | 06026133 | 3/2007 |
| EP | 07004742 | 5/2007 |
| EP | 07024364 | 6/2008 |
| EP | 07024365 | 6/2008 |
| GB | 1268022 | 3/1972 |
| GB | 1506902 | 4/1978 |
| GB | 2050487 A | 1/1981 |
| GB | 2219342 A | 12/1989 |
| JP | 2000310210 A | 7/2000 |
| WO | 80/00162 A1 | 2/1980 |

* cited by examiner

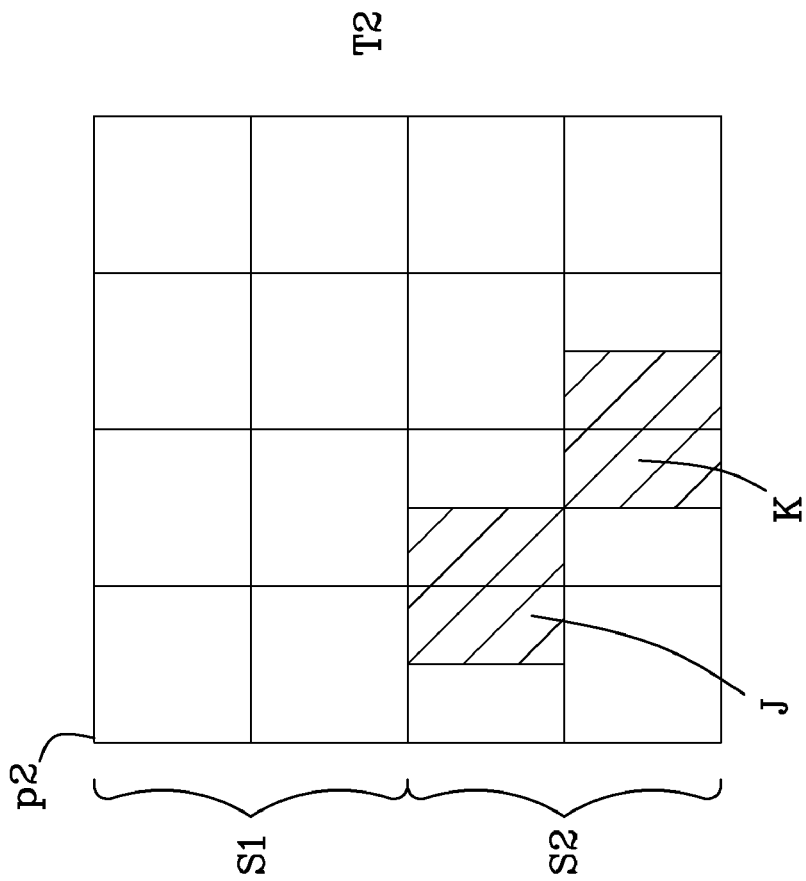
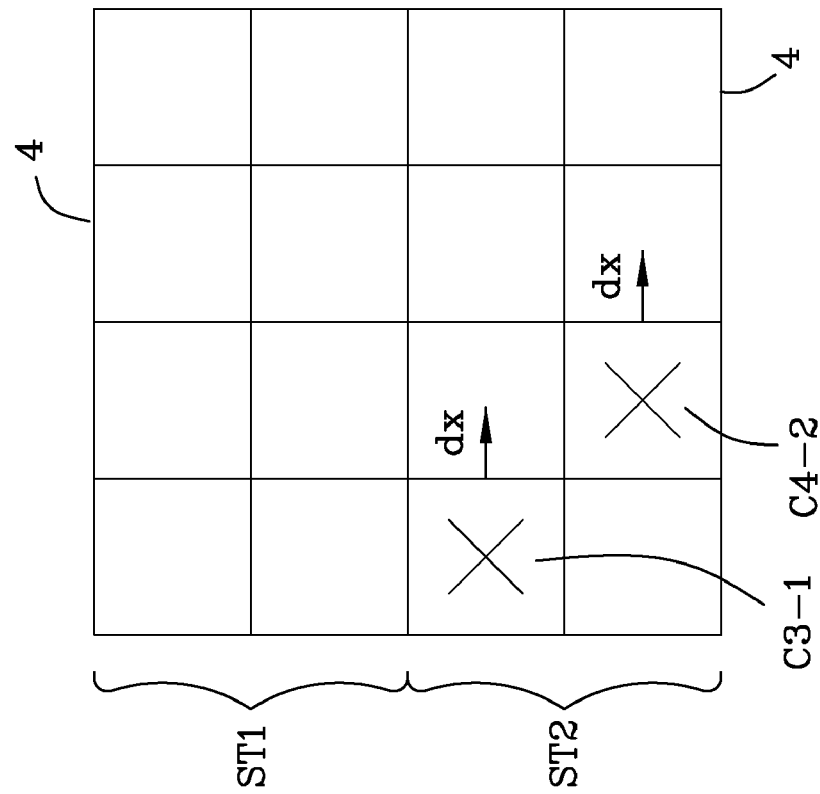
FIG. 6B
FIG. 6A

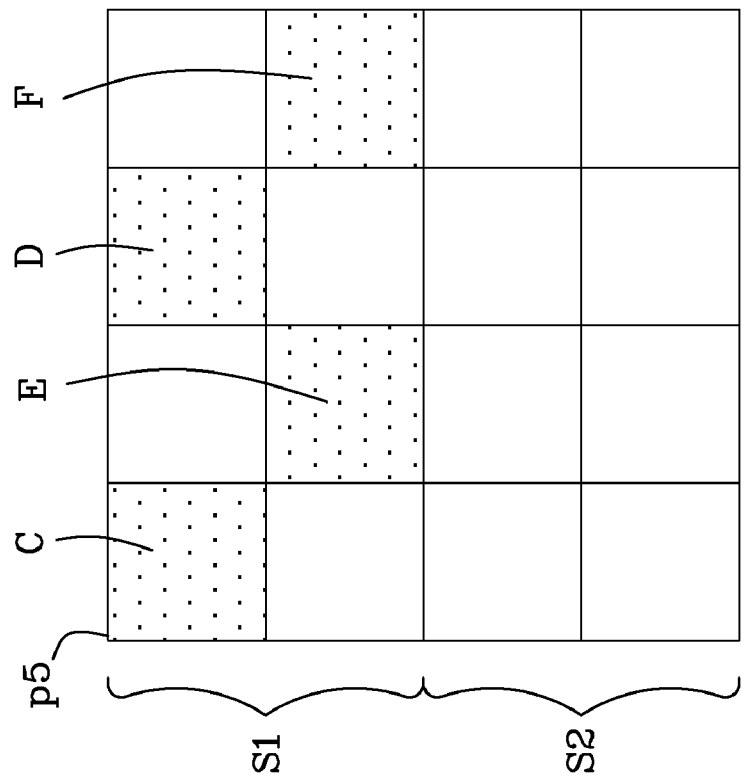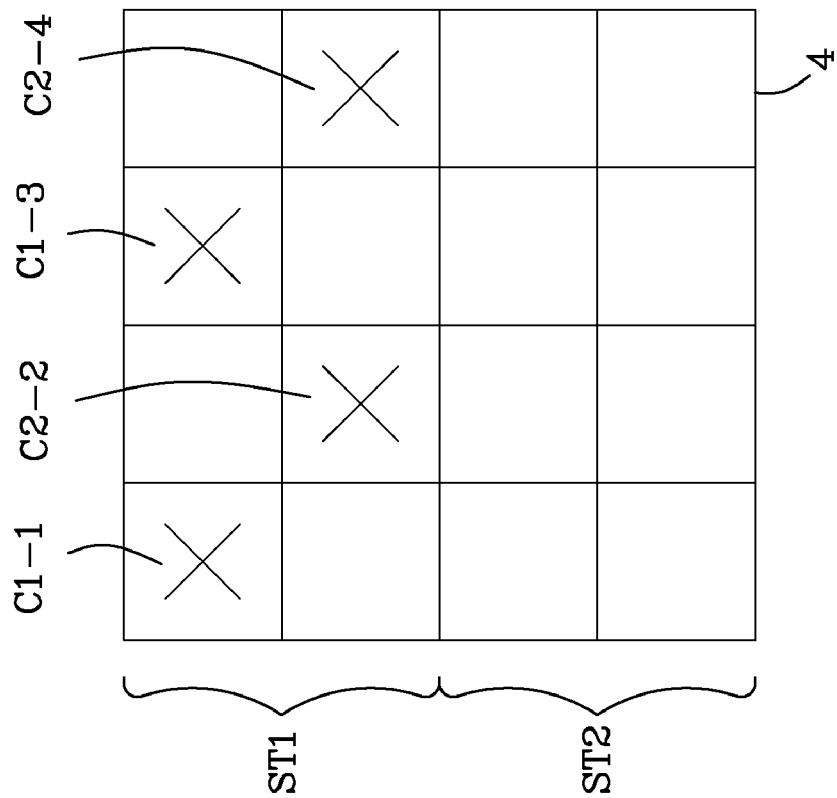

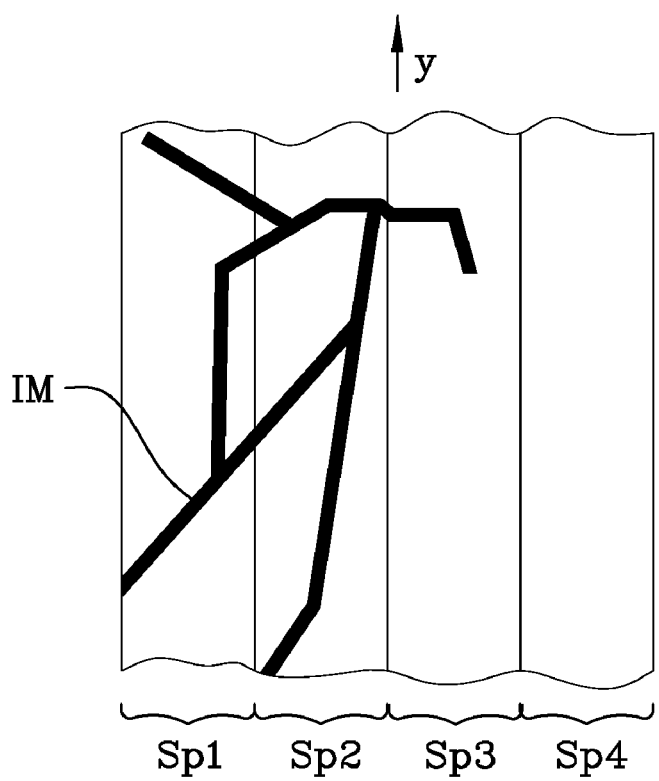
FIG. 15
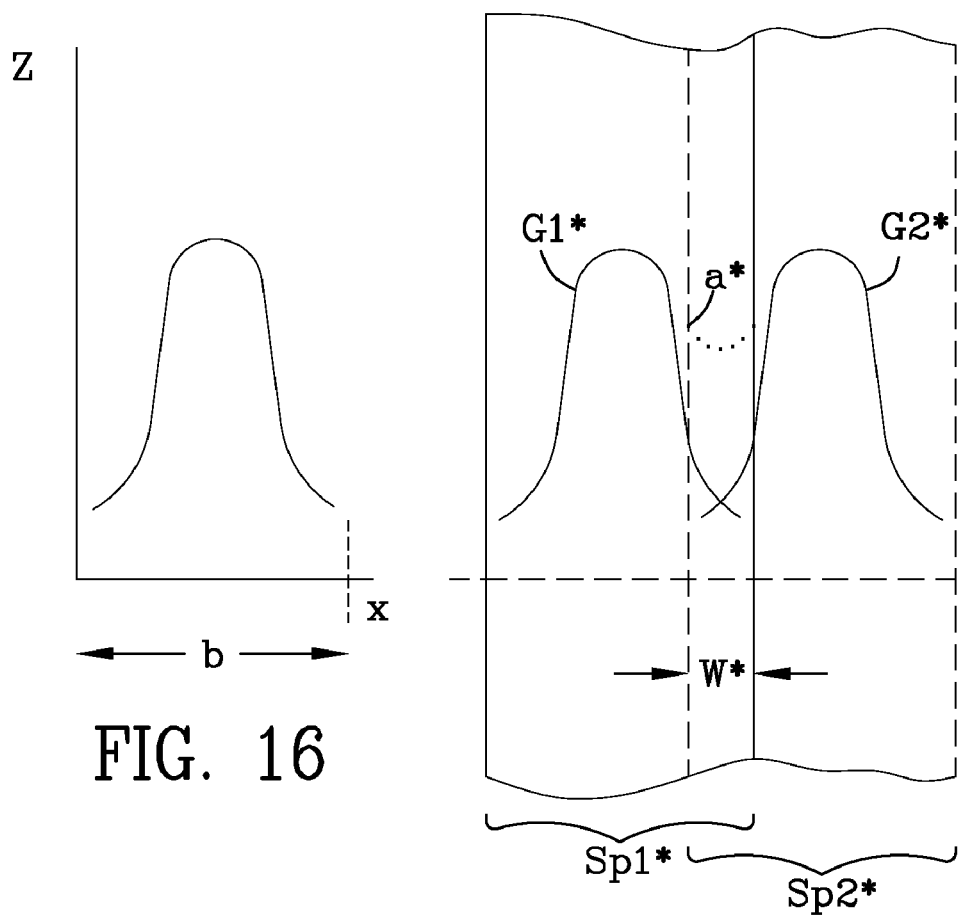
FIG. 16
FIG. 17

HIGH-RESOLUTION PHOTOGRAPHIC PLOTTING PROCESS

Applicant claims priority to German patent application DE 10 2008 022 253.4 filing date May 6, 2008.

BACKGROUND OF THE INVENTION

The invention concerns a photographic plotting process and an arrangement for tracing a computer-stored grid image on a flat photosensitive carrier. Photographic plotting processes and arrangements are used, among other things, for manufacturing photographic patterns for printed circuit boards. According to the current state of the art, a number of different processes and arrangements are already known.

The invention described in this document is most similar to the photographic plotting process described in the German patent application 10 2007 051 990.9-31 and the arrangement for tracing a computer-stored grid image on a flat photosensitive carrier is most similar to the arrangement described in this patent application 10 2007 051 990.9-31.

According to this German patent application 10 2007 051 990.9-31 the grid image T (overall image) is traced dot by dot by a computer program as a series of partial images on an image carrier moving in direction y through an exposure station. All the image dots of a partial image are traced simultaneously.

The partial images are traced at each moment a flash takes place and at which the tracing carrier has moved forward by an equal distance. The amount of this distance corresponds to the length of a side of an image dot or a multiple thereof.

Successive partial images overlap one another partially. The partial images always coincide exactly with a section of the overall image being traced. The image is traced by a light-controlling unit, preferably a semiconductor chip with tilting mirror elements with light-controlling elements arranged in the form of a matrix. In order to trace each partial image, a computer program loads the light-controlling unit with a corresponding control pattern. When the light-controlling unit is exposed to the flash, each light-controlling element conducts a beam of light (as dictated by the pattern) to the image-dot grid position assigned to it on the tracing carrier in order to create the desired image dot. This process of image tracing is used predominantly for making photographic patterns for printed circuit boards, the direct exposure of circuit-board material etc. and manufacturing three-dimensional structures for optical elements.

The resolution of such an image-tracing process is limited to the size of the image dot. The purpose of the invention is therefore to describe a photo-plotting process and an arrangement for executing it in order to obtain a higher image resolution.

BRIEF DESCRIPTION OF THE DRAWINGS

Examples and illustrations of the way in which the invention works are shown in the drawings which are described in more detail below.

FIG. 5A and FIG. 5B
FIG. 6A and FIG. 6B
FIG. 7A and FIG. 7B
FIG. 8A and FIG. 8B
FIG. 9A and FIG. 9B
FIG. 10A and FIG. 10B show a "step-by-step" diagram of the process used for tracing the overall image shown in FIG. 4, where the control pattern for the light-controlling unit is shown schematically in FIGS. 5A, 6A, 7A, 8A, 9A and 10A and the partial images consisting of image dots resulting from the corresponding control patterns is shown in FIGS. 5B, 6B, 7B, 8B, 9B and 10B.

FIG. 15 shows a schematic diagram of a tracing carrier with image tracing arranged in columns.

FIG. 16 is a diagram of the function of the tracing intensity z for image dots with reference to their position over the width of a partial image.

FIG. 17 shows a schematic diagram of two partially overlapping strips for image tracing, each of which shows a pattern of tracing intensity in the image dots similar to a Gaussian curve with reference to their position over the width of the strip.

DESCRIPTION OF THE INVENTION

Figure 1:
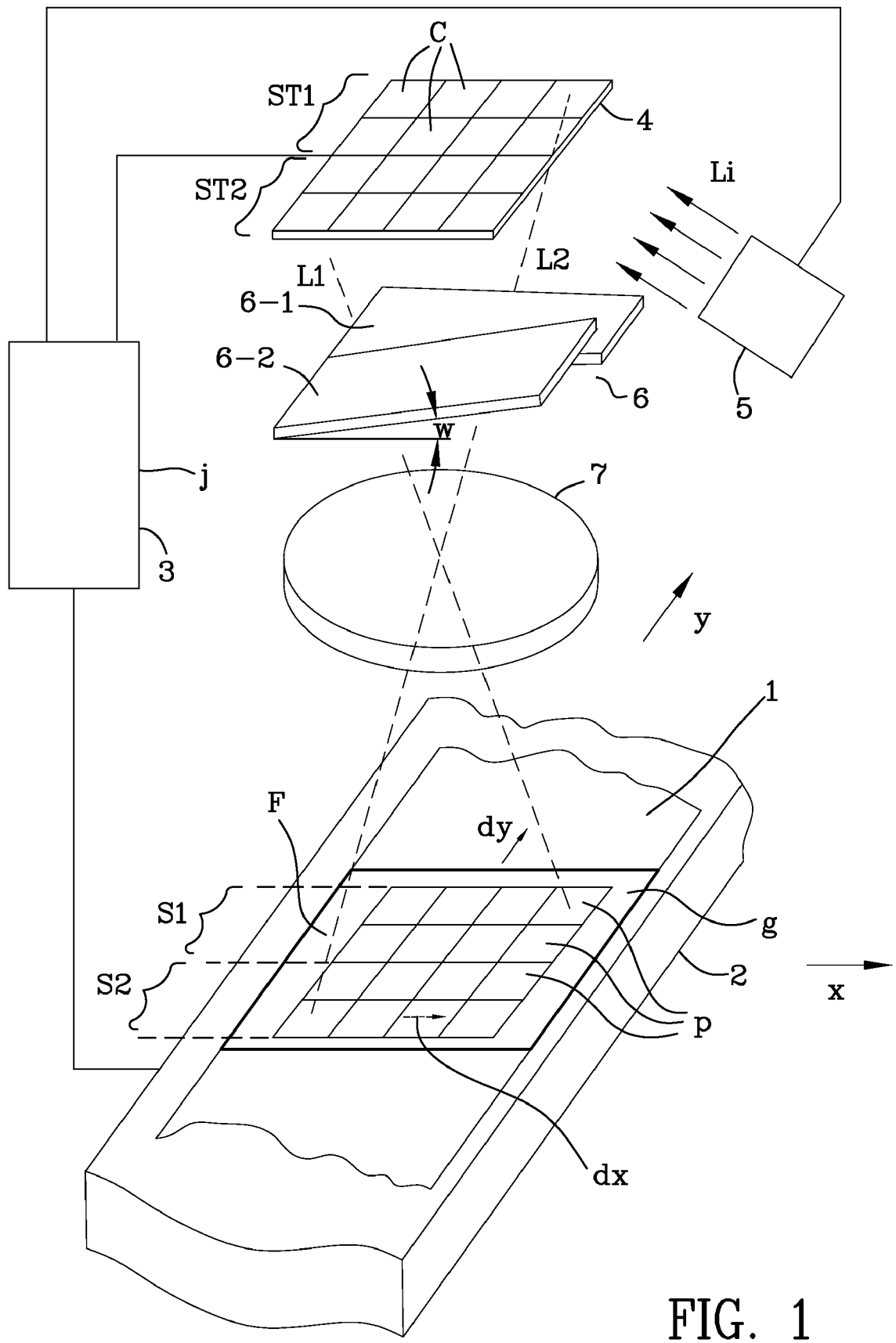
FIG. 1 shows a schematic diagram of an arrangement according to the invention for tracing a computer-stored grid image on a flat photosensitive carrier.

FIG. 1 shows a schematic diagram of an arrangement according to the invention for tracing a computer-stored grid image on a flat photosensitive carrier 1. The grid image to be traced on the flat photosensitive carrier 1 in x/y coordinate alignment (see FIG. 4) is stored in a computer 3 in coded form. The grid-image tracing process is controlled by a computer program.

The computer 3 is connected with a light-controlling unit 4 via a control line.

The light-controlling unit 4 is exposed to light Li (preferably pulsed light) at certain intervals. The light is generated in a light unit 5. The computer 3 is connected with the light unit 5 via a control line.

The light-controlling unit 4 consists of a number of light-controlling elements c arranged similar to a matrix.

The image is traced in an exposure-area field F of an exposure station 9.

The exposure station 9 assumes the same position with reference to the light-controlling unit 4 at each moment of exposure. The exposure-area field F is divided into imaginary image-dot grid positions p arranged like a matrix. Each image-dot grid position can be shifted by a certain amount in direction x, e.g. dx, which is less than the length of a side of an image dot.

The image-dot grid positions p of the exposure-area field F and the matrix-like light-controlling elements c of the light-controlling unit 4 correspond to one another. Each light-controlling element is assigned to an image-dot grid position of the exposure-area field F.

The tracing carrier 1 is located on a moving device 2 (e.g. a transport carriage) which is moved in a straight line y under the light-controlling unit 4 at a constant speed or in steps.

The level at which the tracing carrier 1 is located and the level at which the light-controlling unit 4 is located are always at the same distance.

For each moment of exposure, the light-controlling unit 4 receives a control pattern for tracing the image in the exposure-area field F of the exposure station 9 from the computer program.

Figure 2:
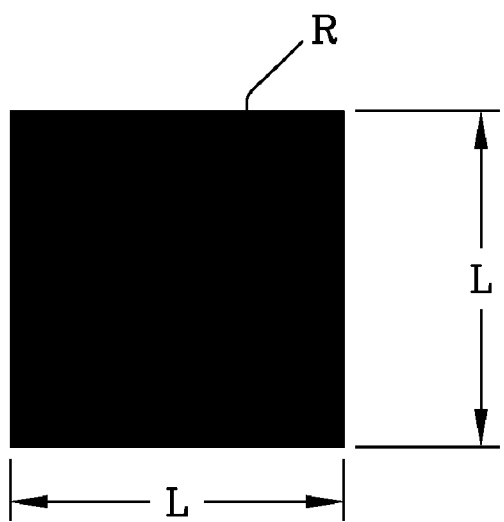
FIG. 2 shows a schematic diagram of a traced light dot.

Between the individual moments of exposure, the tracing carrier is moved by precisely the same amount dy in direction y which is less than the length L of a side of the image dot R (see FIG. 2).

This control pattern controls the light-controlling elements in such a way that when they are exposed to the flash, each light-controlling element points (or does not point) a beam of light at the image-dot grid position of the exposure-area field F assigned to it. The beam of light striking an image-dot grid position causes this image dot to be traced. A beam of light which does not strike causes no image dot to be traced.

The tracing of an image in the exposure-area field F takes place at the same time for all image-dot positions. In each case a partial image is traced. The overall image (FIG. 4) is assembled from several such partially overlapping partial images. These partial images appear on the tracing carrier in y direction at positions which are offset with reference to one another.

A lens 7 which controls the scale of the image is located between the tracing carrier 1 and the light-controlling unit 4. The image dots are traced with sides and heights reversed with reference to their corresponding light-controlling elements, as is indicated for example by light beams 11 and 12.

The computer 3 is connected to the travel device 2 by means of a control cable to record the current position.

The data for the grid image to be traced are passed to the computer 3 via the control line j.

The light-controlling unit is divided into the imaginary strip areas ST1 and ST2. Where (for example) the light-controlling unit is a semiconductor chip with tilting-mirror elements, the light beams Li striking the strip areas ST1 and ST2 are reflected by the tilting-mirror elements. Before they strike the tracing carrier to trace the image dots, they pass through an optical-deflection unit. This consists of a flat glass strip 6-1 for the strip area ST1 and a flat glass strip 6-2 for the strip area ST2.

Both glass strips have the same thickness but are arranged differently with reference to the strip areas assigned to them. The glass strip 6-1 is arranged parallel to the plane of the light-controlling unit 4 and parallel to the plane of the tracing carrier 1. It causes no optical deflection of the light beams passing through it. The light beams striking the strip area ST1 are reflected by the tilting-mirror elements in this area. They pass through the glass strip 6-1 without changing direction and then strike the tracing carrier.

The glass strip 6-2 is diagonally arranged opposite a plane running parallel to the plane of the light-controlling unit 4 and parallel to the plane of the tracing carrier 1. The angle of ascent is marked w.

The light beams striking the strip area ST2 are also reflected by the tilting-mirror elements in this strip area. Before striking the tracing carrier 1, they pass through the glass strip 6-2 and are deflected in direction x. Due to this deflection, offset image dots are traced on the tracing carrier in strip area S2 which is assigned to strip area ST2 of the light-controlling unit 4. These traced image dots appear opposite imaginary light dots traced by undeflected light beams. For example they may be shifted by distance dx in direction x.

The glass strip 6-1 ensures that no interfering differences in travel time occur between the light beams passing through glass strip 6-1 and the light beams passing through glass strip 6-2.

In a traced overall image consisting of several partial images, the following may occur.

a) an undeflected image dot may overlap with an image dot deflected in direction x, b) an undeflected image dot of a partial image may overlap in direction y with an image dot of a subsequently traced partial image because the tracing carrier has travelled by a certain amount in direction y between two successive exposure moments for the tracing of partial images. The travel distance y is less than the length of the side of an image dot.

Figure 3:
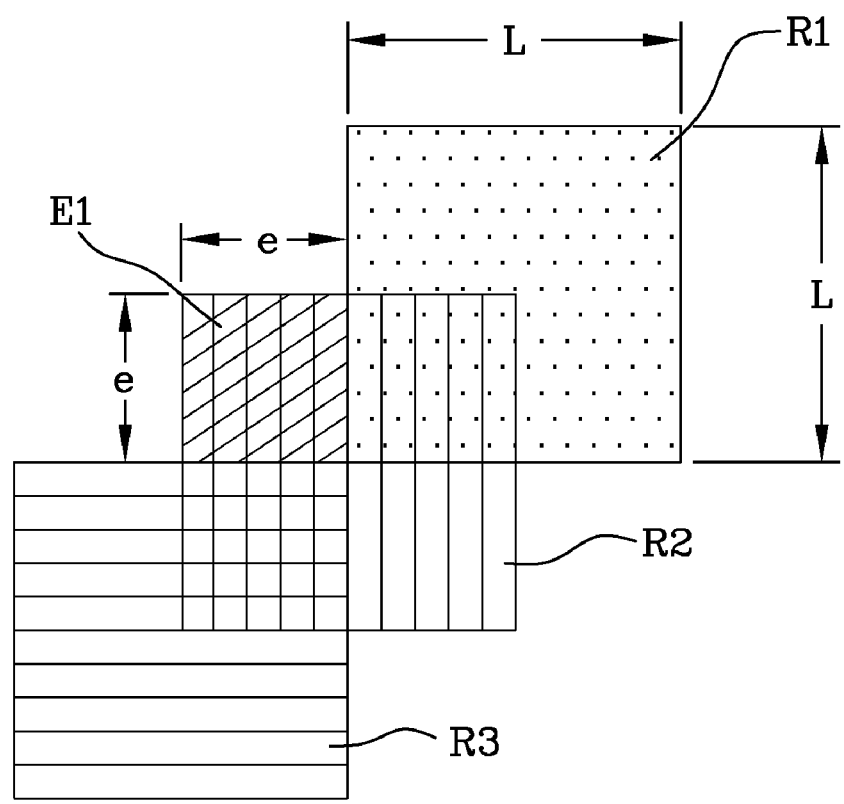
FIG. 3 shows a schematic diagram of image dots overlapping one another in x and y direction.

Through the overlapping of image dots, imaginary small image elements E1 are produced (FIG. 3). These image elements E1 are smaller than the image dots R1, R2 and R3. In the case of the division of the light-controlling unit into 2 strip areas, the deflection distance dx in direction x would be ½ (one half) of the length of the side of an image dot. If the travel distance dy of the tracing carrier in direction y from one moment of exposure to the next moment of exposure is also ½ (one half) of the length of the side of an image dot, imaginary (square) small image elements E1, the length of whose sides is ½ (one half) of the length of the side of an image dot, are produced by the superimposition of overlapping image dots when the image is traced, i.e. the resolution of the overall image traced would have doubled in directions x and y since the overall image now appears to be composed of smaller image elements (and not of larger image dots).

Figure 12:
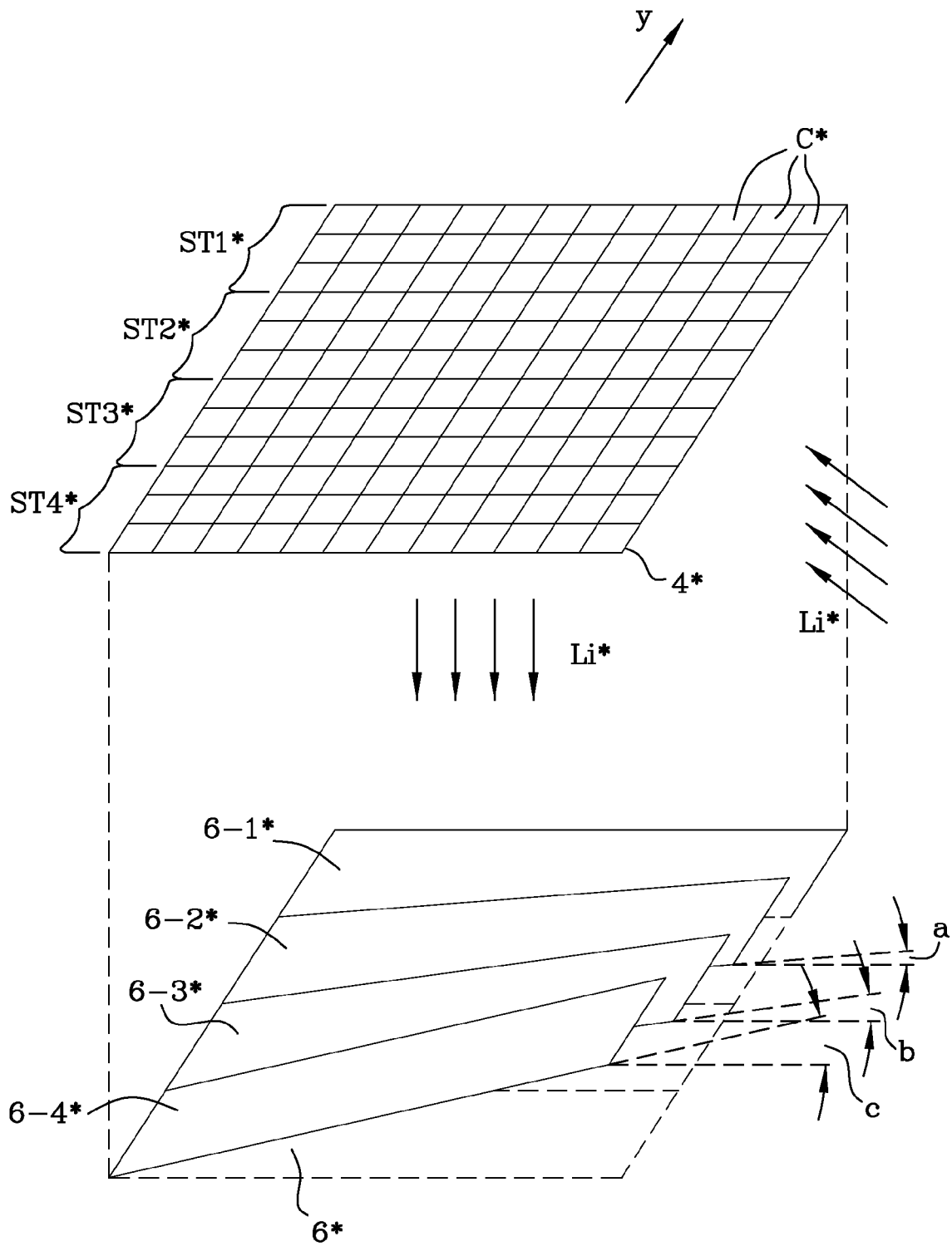
FIG. 12 shows a schematic diagram of a light-controlling unit consisting of 12×12 light-controlling elements divided into four imaginary strip areas, combined with the schematic diagram of an optical unit for deflecting the beams of light for each strip area.

A further increase in the resolution of an overall image is achieved by dividing the light-controlling unit into even more (i.e. more than two) strip areas (e.g. as shown in FIG. 12) during the tracing of the image. In this case, a specially adapted light-deflection unit is required which causes different deflection of the light dots in direction x for each strip area. For division into four strip areas, a) the light beams emitted by the first strip area ST1* to trace the light dots are not deflected, b) the light beams emitted by the second strip area ST2* to trace the light dots are deflected by an amount ¼ the length of the side of an image dot, c) the light beams emitted by the third strip area ST3* to trace the light dots are deflected by an amount 2×¼ the length of the side of an image dot, and d) the light beams emitted by the fourth strip area ST4* to trace the light dots are deflected by an amount 3×¼ the length of the side of an image dot.

For a deflection distance y of the tracing carrier of ¼ the length of the side of an image dot between two successive moments of exposure, imaginary small square image elements with a side length of ¼ of the length of one image-dot side are produced by the overlapping of image dots, i.e. the resolution of an image traced would quadruple in directions x and y (with reference to an image consisting of image dots which do not overlap).

FIG. 2 shows a schematic diagram of a traced light dot R. When observed ideally, the image dot R is square in shape and has a side length of L. With modern photo-plotters, the image dot has a side length of approx. 10-15 micrometres. The invention includes image dots of all shapes, although it is explained only in terms of square image dots. Image dots which are not square in shape would require corresponding additional mathematical calculation for the process according to invention.

For reasons of simplicity, image dots are indicated by hatching or dotting in the figures.

FIG. 3 shows a schematic diagram of image dots R1 (dotted), R2 (vertically hatched) and R3 (horizontally hatched) overlapping one another in x and y directions. All the image dots have a side length of L. In the example depicted, they overlap by half the length of a side L/2 in directions x and y.

This overlapping creates (for example) an imaginary small square image element E1 with a side length e=L/2. This image element E1 is smaller than an image dot. For this reason, the indicated overlap of the image dots produces twice the resolution in both directions x and y.

A further increase in resolution is described with reference to FIG. 12.

Figure 4:
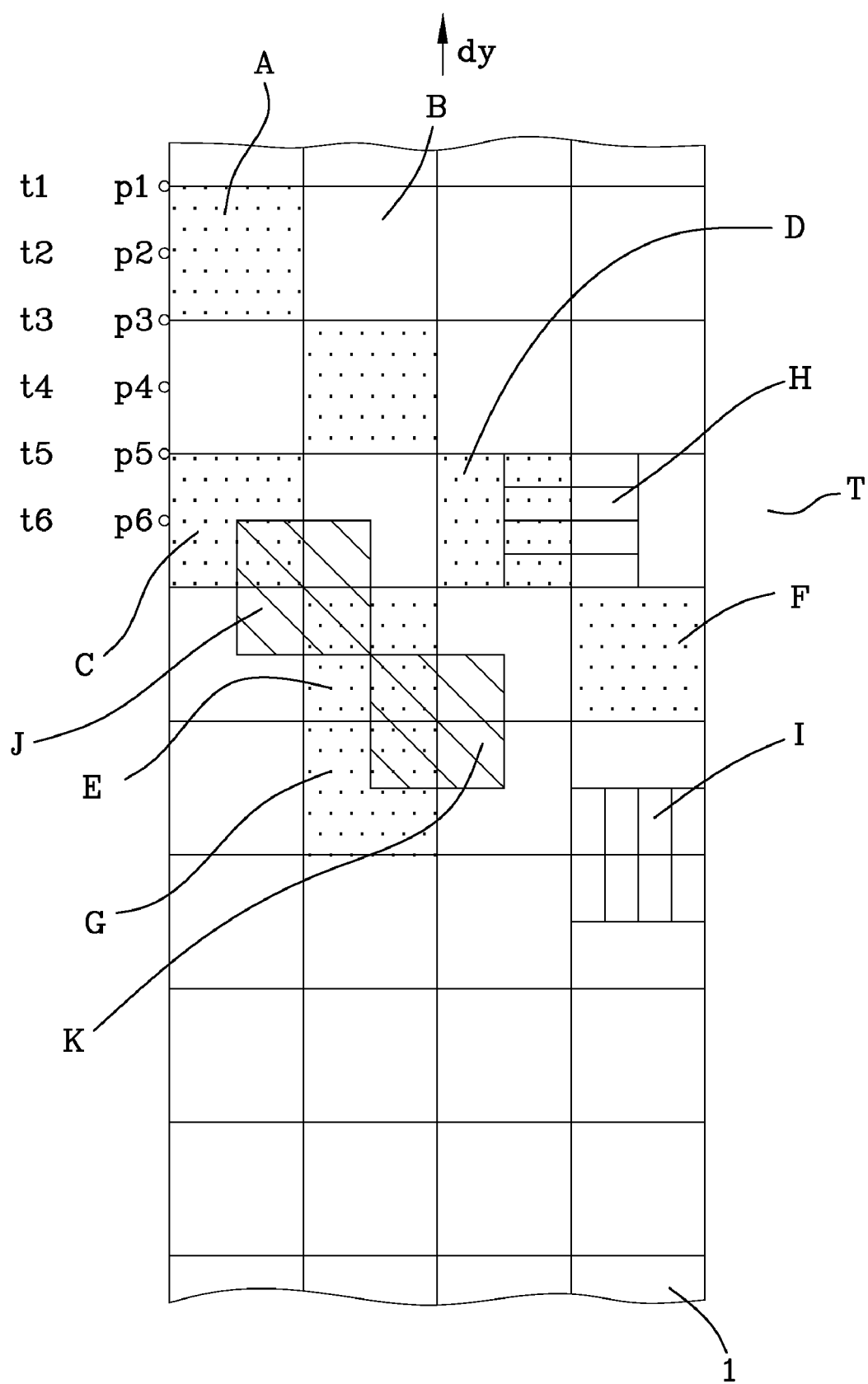
FIG. 4 shows a schematic diagram of an example of an overall image which was traced with a light-controlling unit consisting of 4×4 light-controlling elements.

FIG. 4 shows a schematic diagram of an example of an overall image T. The overall image T is composed of several image dots A, B, C, D, E, F, G, H, and I. The overall image T in FIG. 4 is constructed by a position-network grid. The overall image T consists of image dots which may be arranged as follows:

a) The image dot fills a network-grid position such as the image dots A, B, C, D, E, F, G (dotted);

b) The image dot, e.g. dot H (horizontally hatched) is deflected by a distance x in direction x with reference to a network-grid position (in the example in FIG. 4, the deflection distance x amounts to dx=½ the length of the side of the image dot);

c) The image dot, e.g. dot I (vertically hatched) is deflected by a distance y in direction y with reference to a network-grid position (in the example in FIG. 4, the deflection distance y amounts to dy=½ the length of the side of the image dot); thus dy=dx; the deflection distance y is caused by the advancing of the tracing carrier between two exposure moments;

d) The image dot, e.g. dots J and K (diagonally hatched) are deflected both in x and y directions (with reference to a network-grid position) by the amounts dx and dy.

The overall image T is stored in coded form in the computer. The control pattern for each moment of exposure t1, t2, t3, t4, ... with which the light-controlling unit generates the partial images, is derived from these stored data. A partial image is traced (in the exposure station 9 (FIG. 1)) for each moment of exposure. Between two successive moments of exposure, the tracing carrier advances by the amount dy=½ the side length of an image dot in direction y.

The partial images traced on the tracing carrier overlap one another partially. The overall image T is produced by the superimposition of all the partial images.

FIG. 5A and FIG. 5B
FIG. 6A and FIG. 6B
FIG. 7A and FIG. 7B
FIG. 8A and FIG. 8B
FIG. 9A and FIG. 9B
FIG. 10A and FIG. 10B show a "step-by-step" diagram of the process used for tracing the overall image T shown in FIG. 4, where the control pattern for the light-controlling unit is shown schematically in FIGS. 5A, 6A, 7A, 8A, 9A and 10A and the partial images T1 to T6 consisting of image dots resulting from the corresponding control patterns is shown in FIGS. 5B, 6B, 7B, 8B, 9B and 10B.

The overall image T shown in FIG. 4 is generated in the following ("scrolling") steps.

Figure 10B:
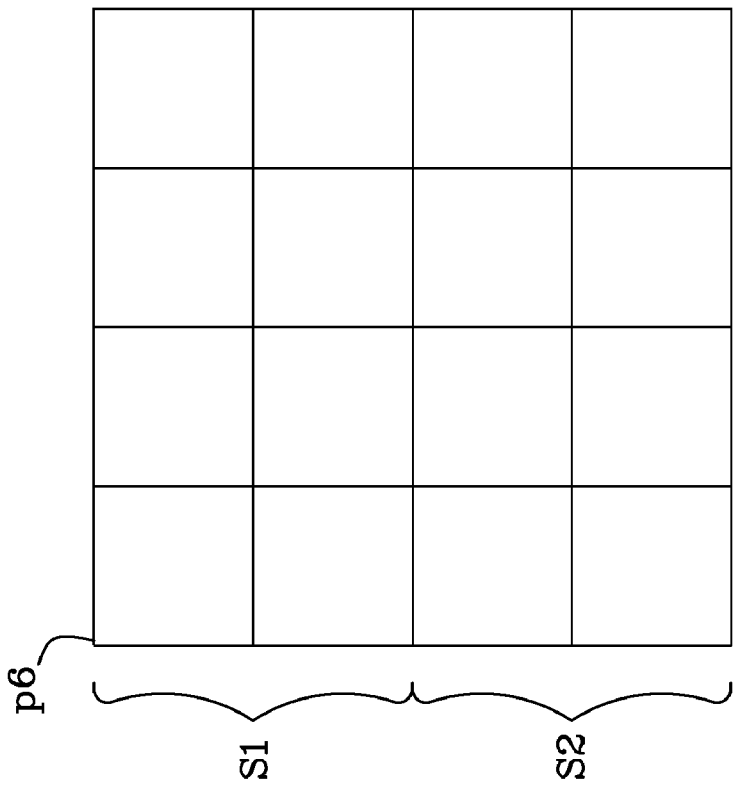
Figure 10A:
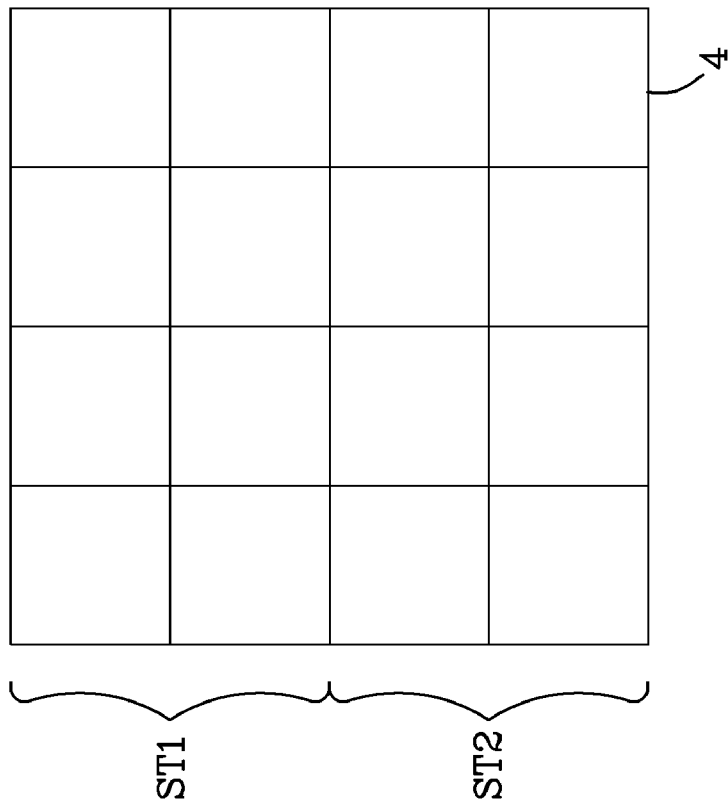

Exposure moment t1: tracing of partial image T1
(see FIG. 5A and FIG. 5B)
Exposure moment t2: tracing of partial image T2
(see FIG. 6A and FIG. 6B)
Exposure moment t3: tracing of partial image T3
(see FIG. 7A and FIG. 7B)
Exposure moment t4: tracing of partial image T4
(see FIG. 8A and FIG. 8B)
Exposure moment t5: tracing of partial image T5
(see FIG. 9A and FIG. 9B)
Exposure moment t6: tracing of partial image T6
(see FIG. 10A and FIG. 10B)

The partial images T1, T2, T3, T4 are placed on the tracing carrier in such a way that the upper left-hand corner p1 of the partial image T1 (FIG. 5B) coincides with position p1 on tracing carrier 1 in FIG. 4, that the upper left-hand corner p2 of the partial image T2 (FIG. 6B) coincides with position p2 on tracing carrier 1 in FIG. 4, that the upper left-hand corner p3 of the partial image T3 (FIG. 7B) coincides with position p3 on tracing carrier 1 in FIG. 4 etc.

Each of the partial images is deflected by the amount dy=½ the length of a side of the image dot in direction y.

This deflection dy of the partial images results from the fact that the tracing carrier passing the exposure station travels in direction y by the amount dy between successive moments of exposure.

For the example in FIG. 5, dy=dx which is half the side-length of an image dot in size.

Since the network grid for the overall image T has a width of 4 network-grid positions, the corresponding light-controlling unit 4 must consist of 4×4 light-controlling elements.

The 4×4 light-controlling elements of the light-controlling unit are assigned to the 4×4 image dot positions of a partial image. Like the overall image, the partial image is constructed with a position network grid to identify the image dot positions.

Figure 5B:
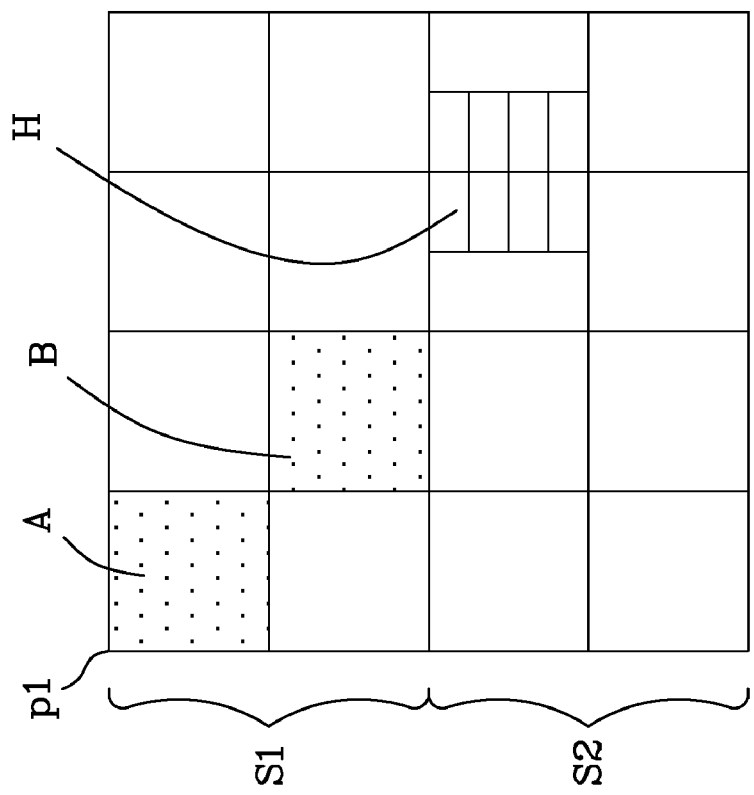
Figure 5A:
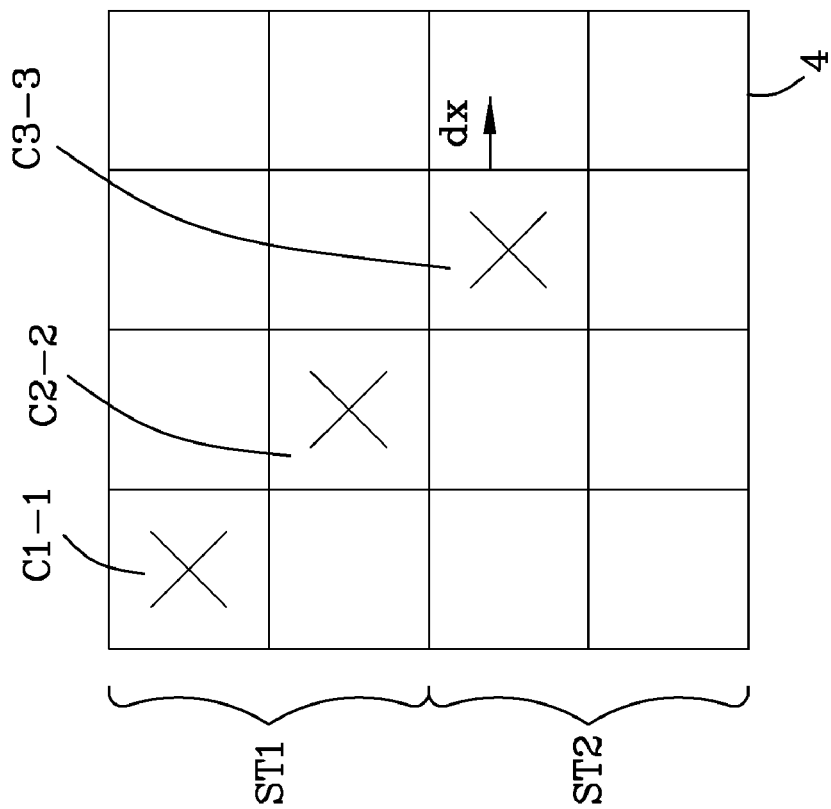
Figure 7B:
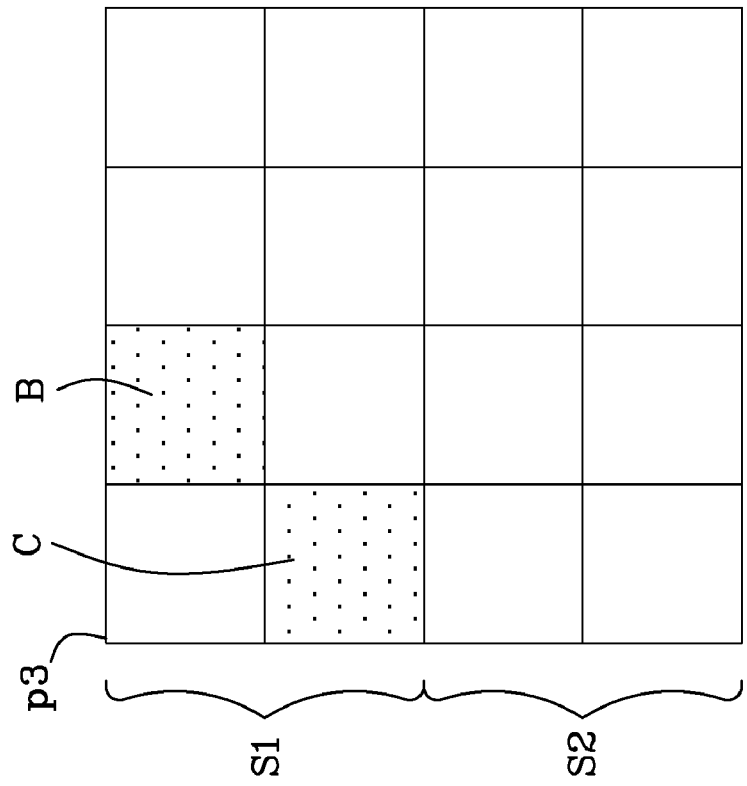
Figure 7A:
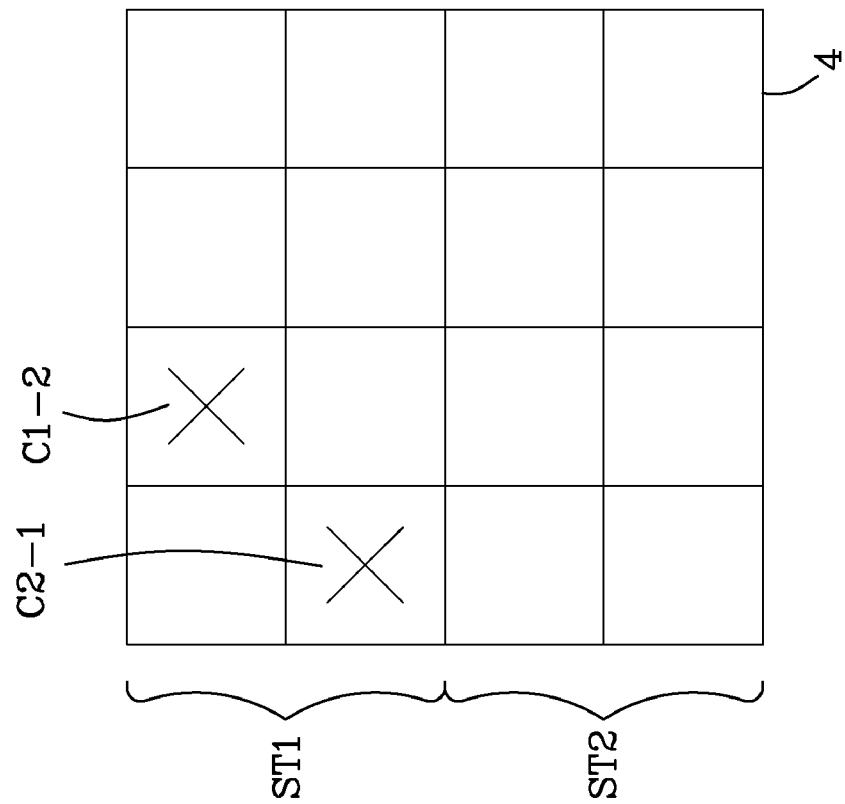
Figure 8B:
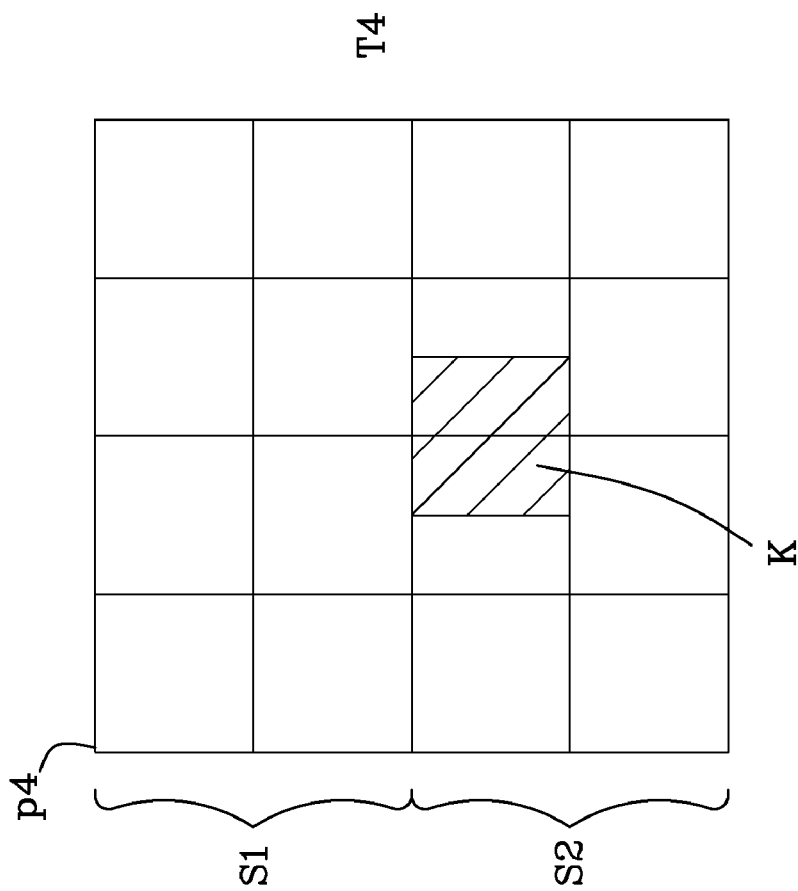
Figure 8A:
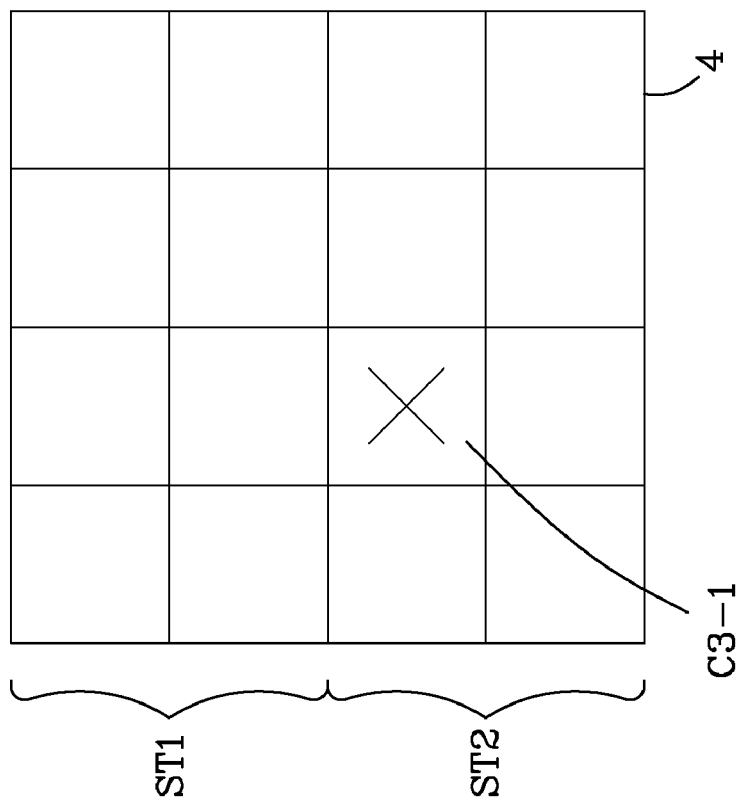

The image dots traced in a partial image may be arranged as follows:

a) the image dot fills a network-grid position, e.g. the image dots A and B etc. or b) the image dot (e.g. image dot H) is deflected by distance x in direction x with reference to a network-grid position (in the examples in FIG. 4 and FIG. 5B, deflection distance x is ½ of the side length of the image dot and is marked dx.

The arrangement of the image dots according to a) above or b) above takes place in certain areas of the partial image which correspond to those areas of the light-controlling unit.

For this example (light-controlling unit consisting of 4×4 light-controlling elements, deflection distance x dx=½ the length of a side of an image dot (in this case the denominator 2 in ½ is important) the light-controlling unit is divided into 2 imaginary strip areas ST1 and ST2, one beneath the other. Each strip area is the same size and contains the same number of light-controlling elements arranged in two rows in each.

The area S1 of the partial image is assigned to the strip area ST1 of the light-controlling unit, and the area S2 of the partial image is assigned to the strip area ST2 of the light-controlling unit. The deflection distance y is equal to the deflection distance x.

For the tracing process of the partial image the following applies:

The light-controlling elements of the strip area ST1 of the light-controlling unit trace image dots at network-grid positions in the area S1 of the partial image. These image dots "fit" exactly into the position fields fixed by the network grid.

The light-controlling elements of the strip area ST2 of the light-controlling unit trace image dots at positions in the area S2 of the partial image which do not coincide with the network-grid positions and which are deflected by distance x in direction x with reference to these (here, dx=½ the length of a side of an image dot).

The deflection x of the image dots is achieved as follows: the beams of light emitted by the appropriate light-controlling elements for tracing image dots are deflected optically in direction x before they strike the tracing carrier. These deflected beams of light cause deflected image dots to be traced.

As shown in FIG. 12, it should be remembered that a light-controlling unit may also be divided into strips differently. For example, in order to trace an overall image with a width of 12 network-grid positions, a light-controlling unit with 12×12 light-controlling elements would be needed. This may be divided into four imaginary strip areas each with three rows of light-controlling elements, where the light-controlling elements of the strip area ST1 of the light-controlling unit trace image dots at network-grid positions in the area S1 of the partial image. These image dots "fit" exactly into the position fields fixed by the network grid;

The light-controlling elements of the strip area ST2* of the light-controlling unit trace image dots at positions in the area S2* of the partial image which do not coincide with the network-grid positions and which are deflected by distance x (¼ the length of a side of an image dot) in direction x with reference to these;

The light-controlling elements of the strip area ST3* of the light-controlling unit trace image dots at positions in the area S3* of the partial image which do not coincide with the network-grid positions and which are deflected by distance x (2×¼ the length of a side of an image dot) in direction x with reference to these;

The light-controlling elements of the strip area ST4* of the light-controlling unit trace image dots at positions in the area S4* of the partial image which do not coincide with the network-grid positions and which are deflected by distance x (3×¼ the length of a side of an image dot) in direction x with reference to these.

When this principle for the tracing of images is known, it becomes easy to verify the layout of the control patterns and partial images in FIGS. 5A and 5B to 10A and 10B with reference to the overall image T in FIG. 4.

It is possible to proceed as follows. If we imagine that the partial images are drawn on transparent paper and are laid one after another on the overall image with reference to the position network grid, and the points p1, p2, p3 . . . in the partial images are precisely aligned with those of the overall image T, it can be seen from the partial image T1 which image dots in the overall image are located in the position grid of S1. These are image dots A and B.

It can then be seen which image dots of the overall image (if any) which are deflected in direction x by the amount dx, are located in the area S2. In this case it is image dot H.

On the basis of the principle explained above it can then be determined a) whether the appropriate light-controlling elements (in this case c1-1 and c2-2) for tracing image dots A and B are also activated for the image dots A and B in the area ST1 of the light-controlling unit 4 to be traced in partial image T1 (ST1 is assigned to area S1 of the partial image T1);

b) whether the appropriate light-controlling element (in this case c3-3) for tracing the deflected image dot H is also activated for the image dot H in the area ST2 of the light-controlling unit 4 to be traced in partial image T1 (ST2 is assigned to area S2 of the partial image T1).

For partial image T2, it can be determined which image dots in the overall image fall within the position grid of S1, i.e. none.

It can then be seen which image dots of the overall image (if any) which are deflected in direction x by the amount dx, are located in the area S2. In this case these are dots J and K.

On the basis of the principle explained above it can then be determined:

b) whether the appropriate light-controlling elements (in this case c3-1 and c4-2) for tracing the deflected image dots J and K are also activated for the image dots J and K in the area ST2 of the light-controlling unit 4 to be traced in partial image T2 (ST2 is assigned to area S2 of the partial image T2).

For partial image T3, it can be determined which image dots (if any) in the overall image fall within the position grid of S1. These are image dots B and C.

It can then be seen which image dots of the overall image (if any) which are deflected in direction x by the amount dx, are located in the area S2, i.e. none.

On the basis of the principle explained above it can then be determined:

a) whether the appropriate light-controlling elements (in this case c1-2 and c2-1) for tracing the image dots B and C are also activated for the image dots B and C in the area ST1 of the light-controlling unit 4 to be traced in partial image T3 (ST1 is assigned to area S1 of the partial image T3.

For partial image T4, it can be determined which image dots (if any) in the overall image fall within the position grid of S1, i.e. none.

It can then be seen which image dots of the overall image (if any) which are deflected in direction x by the amount dx, are located in the area S2. In this case it is dot K.

On the basis of the principle explained above it can then be determined:

b) whether the appropriate light-controlling element (in this case c3-1) for tracing the deflected image dot K is also activated for the image dot K in the area ST2 of the light-controlling unit 4 to be traced in partial image T4 (ST2 is assigned to area S2 of the partial image T4).

For partial image T5, it can be determined which image dots in the overall image fall within the position grid of S1. These are image dots C, D, E and F.

It can then be seen which image dots of the overall image (if any) which are deflected in direction x by the amount dx, are located in the area S2. In this case, none.

On the basis of the principle explained above it can then be determined:

a) whether the appropriate light-controlling elements (in this case c1-1 and c1-3, c2-2 and c2-4) for tracing the image dots C, D, E and F are also activated for the image dots C, D, E and F in the area ST1 of the light-controlling unit 4 to be traced in partial image T5 (ST1 is assigned to area S1 of the partial image T5).

For partial image T6, it can be determined which image dots in the overall image fall within the position grid of S1. In this case, none.

It can then be seen which image dots of the overall image (if any) which are deflected in direction x by the amount dx, are located in the area S2, i.e. none.

Figure 11:
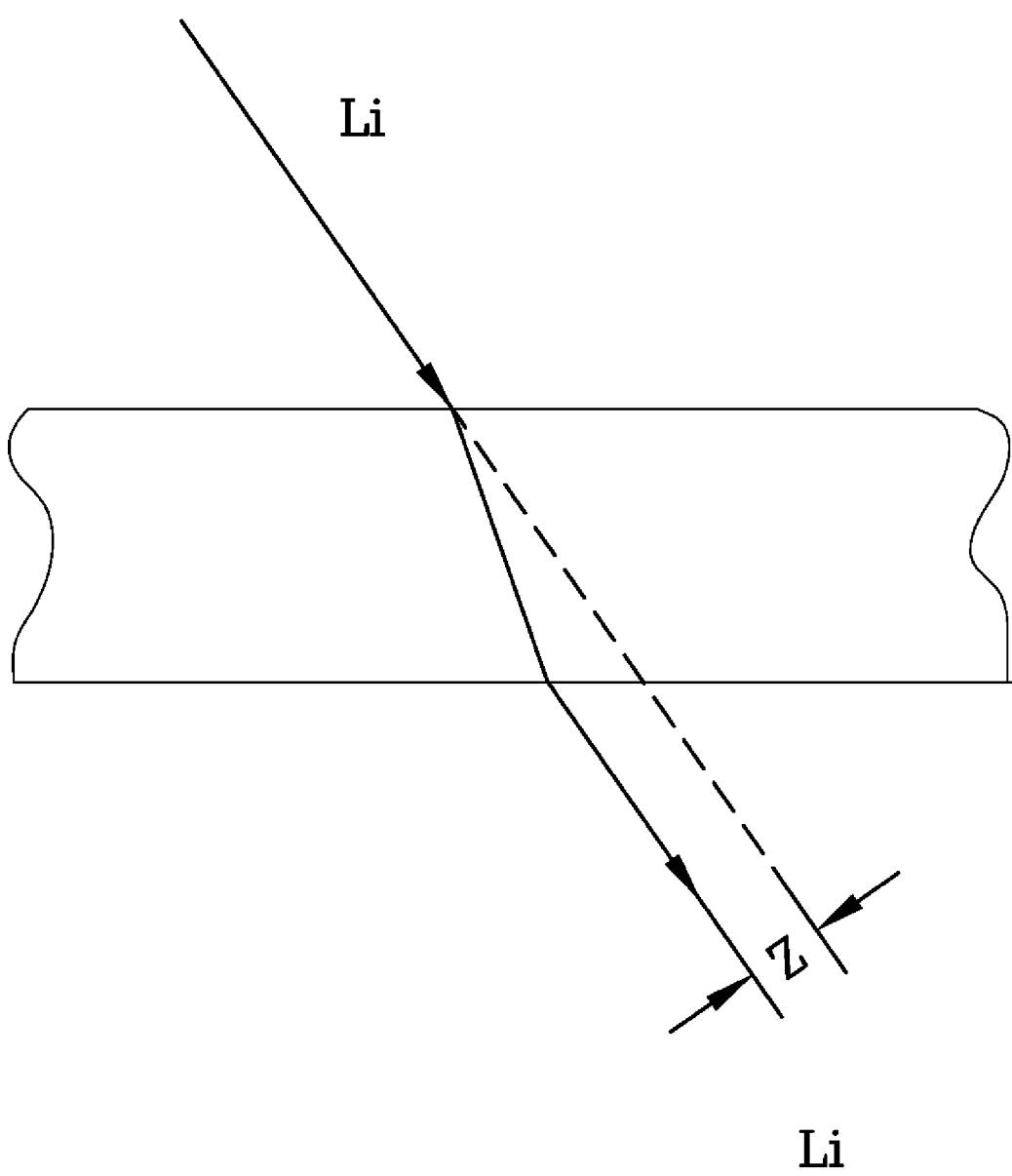
FIG. 11 shows a schematic diagram of Snell's Law of Optics governing the path of a beam of light penetrating a flat sheet of glass diagonally.

FIG. 11 shows a schematic diagram of Snell's Law of optics governing the path of a beam of light Li diagonally penetrating a flat sheet of glass G. When it emerges from the sheet of glass, the beam is deflected by the amount z due to refraction of the light on entering and emerging from the glass. This law is used to deflect the beams of light emitted from the light-controlling elements of a strip area of the light-controlling unit before they strike the tracing carrier (in direction x) to trace the dots.

FIG. 12 shows a schematic diagram of an optical light-deflection unit 6* for implementing the invention in a light-controlling unit 4* consisting of 12×12 light-controlling elements divided into four imaginary strip areas ST1*, ST2*, ST3* and ST4*.

The optical light-deflection unit 6* for shifting the light beams generating the image dots consists of glass plates 6-1*, 6-2*, 6-3* and 6-4*.

The light-controlling unit 4* (here a semiconductor chip with tilting-mirror elements) is divided into several strip areas ST1*, ST2*, ST3* and ST4* arranged one beneath the other.

One glass plate 6-1*, 6-2*, 6-3* 6-4* is assigned to each of these strip areas ST1*, ST2*, ST3* and ST4*. The beams of light passing through the light-deflection unit 6* cause the dots to be traced on the tracing carrier (not shown).

The glass plate 6-1* (arranged parallel to the light-controlling unit 4*) which is assigned to the strip area ST1 does not cause any deflection of the light beams emerging from the strip area ST1*. It serves only to avoid any differences in the time taken for the light beams to pass through the other plates of glass 6-2*, 6-3* 6-4*.

The glass plate 6-2* assigned to the strip area ST2* is tilted by angle a (approximately 0.3 degrees) with reference to a plane E* parallel to the light-controlling unit 4*.

It causes a shift in the light beams guided by strip area ST2* which in turn causes the image dots traced to be deflected by the amount dx in direction x.

The glass plate 6-3* assigned to the strip area ST3* is tilted by angle b (approximately 2×0.3 degrees) with reference to a plane E* parallel to the light-controlling unit 4*.

It causes a shift in the light beams guided by strip area ST3* which in turn causes the image dots traced to be deflected by the amount 2×dx in direction x.

The glass plate 6-4* assigned to the strip area ST4* is tilted by angle c (approximately 3×0.3 degrees, c>b) with reference to a plane E* parallel to the light-controlling unit 4*.

It causes a shift in the light beams guided by strip area ST4* which in turn causes the image dots traced to be deflected by the amount 3×dx in direction x.

All the beams of light guided by the light-controlling elements of a strip area for tracing the image dots of a partial image are deflected simultaneously by the same deflection distance x.

For the individual strip areas ST2*, ST3* and ST4* the deflection of the light beams is different in each case.

The invention is not (as explained up until now) limited only to y travel distances smaller than the length of a side of an image dot.

Explanations now follow for y travel distances in image tracing which are greater than the length of a side of an image dot.

Length of a Side of an Image Dot L<Travel Distance y<2L

In the example illustrated by FIG. 4 it was assumed that the tracing carrier 1 advanced by the smallest possible y distance dy between the exposure moments t1, t2, t3, t4, t5 . . . . In the example given, this is equivalent to ¼ of the length L of the side of an image dot. The 4 in ¼ is due to the division of the light-controlling unit into 4 strip areas. A partial image is traced at each moment of exposure. The partial images are positioned on the tracing carrier in such a way that their top left-hand corner p1, p2, p3, . . . coincides with the positions p1, p2, p3, . . . on the tracing carrier.

According to the invention, the tracing of the image can be speeded up if a larger value (according to length of image-dot side L<y travel distance<2L) is chosen for the y distance between successive moments of exposure. In this case, there would be a greater interval of time between successive moments of exposure. This y travel distance (equal in size to the side length L of an image dot B) is calculated as follows:
y travel distance=side length L of an image dot+k: m k=1, 2, 3, . . . (m-1); k is an integral number and goes to max. (m-1)

m=2, 3, 4, 5 . . . ; m is an integral number and is equivalent to the number of strip areas Exceptions are y travel distances written in unreduced numerator/denominator form where numerator and denominator have a common divisor. (The number of rows of light-controlling elements in the light-controlling unit must always be divisible by m because each strip area comprises the same number of rows).

This relationship is illustrated using the following examples. Example 1 as illustrated in FIG. 14A and FIG. 14B):

a light-controlling unit with 12×12 light-controlling elements is divided into 4 (m=4) phase areas ST1', ST2', ST3' and ST4'. Each phase area contains three rows of light-controlling elements (FIG. 14A). Similar to the example in FIG. 4, the division into 4 phase areas gives rise to the smallest possible y travel distance of ¼ the length L of a side of an image dot B (as well as the smallest possible x deflection distance of ¼ the length of a side of an image dot).

However, according to the invention, the partial image can also be traced at exposure moments which are further apart in time, where the tracing carrier has travelled a greater equal distance between such successive moments of exposure.

Figure 14A:
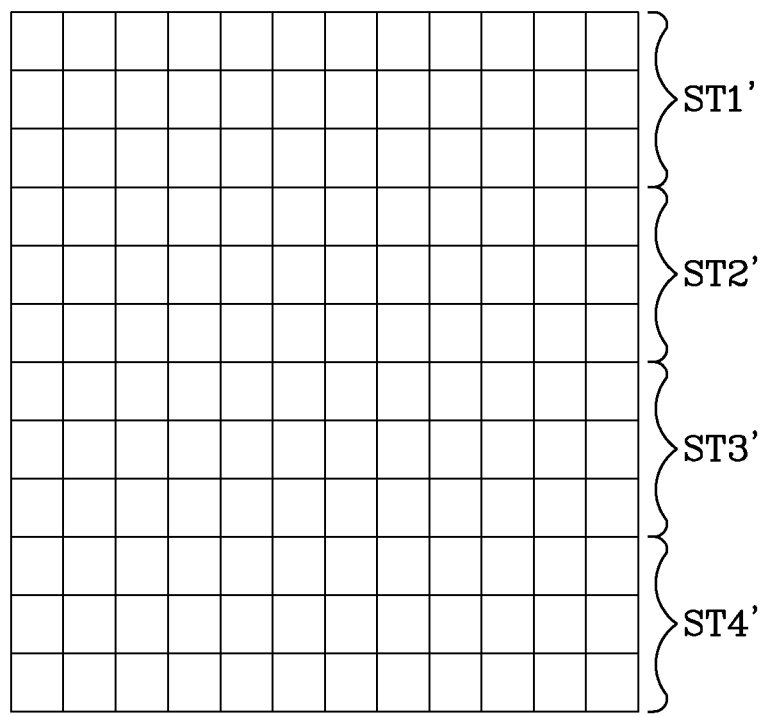
FIG. 14A shows a schematic diagram of a light-controlling unit with 12×12 light-controlling elements which is divided into four strip areas each with three rows of light-controlling elements.
Figure 14B:
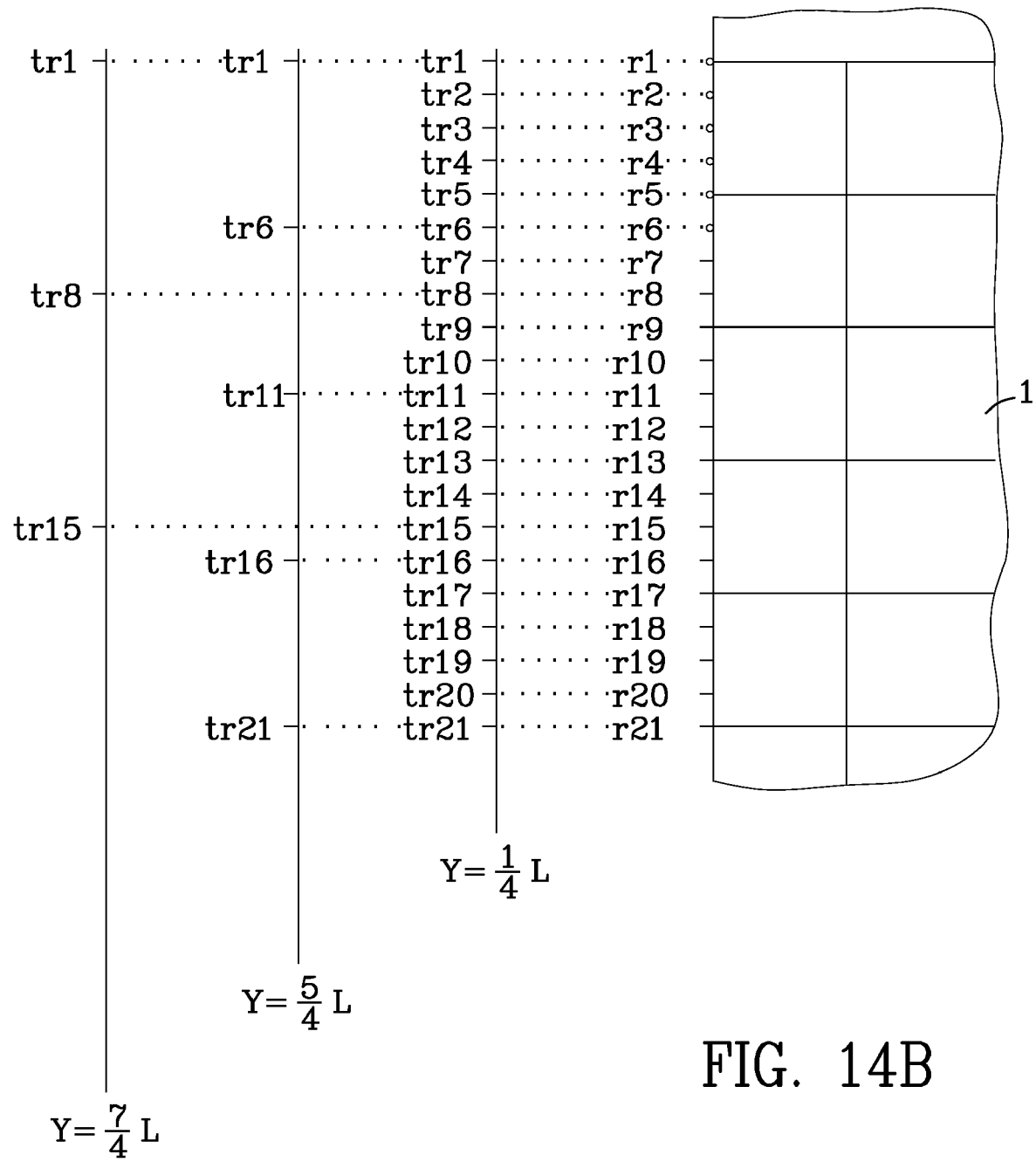
FIG. 14B shows a schematic diagram of a tracing carrier (in analogy to FIG. 4) for tracing partial images taking into account the division of the light-controlling unit according to FIG. 14A for different equidistant y travel distances.

FIG. 14B shows a schematic diagram of a tracing carrier (in analogy to FIG. 4) with a position network grid for tracing partial images taking into account FIG. 14A for different y travel distances which are equidistant in each case (y=1/4 L; 5/4 L and 7/4 L where L is the length of the side of an image dot R).

Partial images could be traced at moments tr1, tr2, tr3, tr4, tr5, tr6, tr7 . . . where the tracing carrier travels the smallest possible y distance (=¼ the length of the side of an image dot) between two successive moments of exposure. When the partial images (not shown) are traced on the tracing carrier, these are aligned to the positions r1, r2, r3, r4. For equidistant y travel distances of ¼ L each, the exposure moments tr1, tr2, tr3, tr4 . . . lie on the "time line" for ¼ L.

However, according to the invention, the partial image can also be traced at exposure moments which are further apart in time, where the tracing carrier has travelled a greater equal distance between such successive moments of exposure.

According to the diagram, for equidistant y travel distances of 5/4 L, the exposure moments at tr1, tr6, tr11, tr16 . . . lie on the "time line" for 5/4 L shown in FIG. 14B.

According to the diagram, for equidistant y travel distances of 7/4 L, the exposure moments at tr1, tr8, tr15, tr22 . . . lie on the "time line" for 7/4 L shown in FIG. 14B.

Figure 13A:
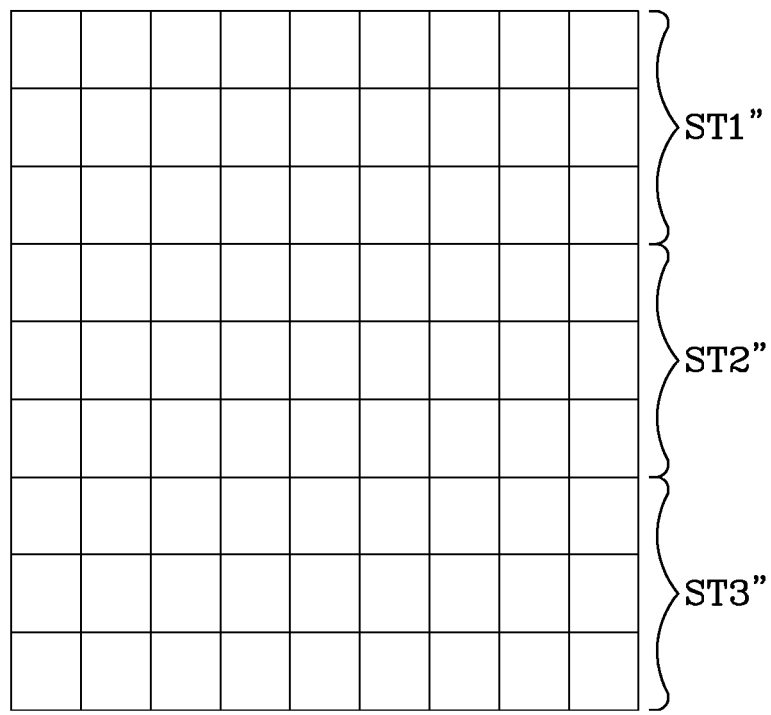
FIG. 13A shows a schematic diagram of a light-controlling unit consisting of 9×9 light-controlling elements divided into three strip areas each with three rows of light-controlling elements.
Figure 13B:
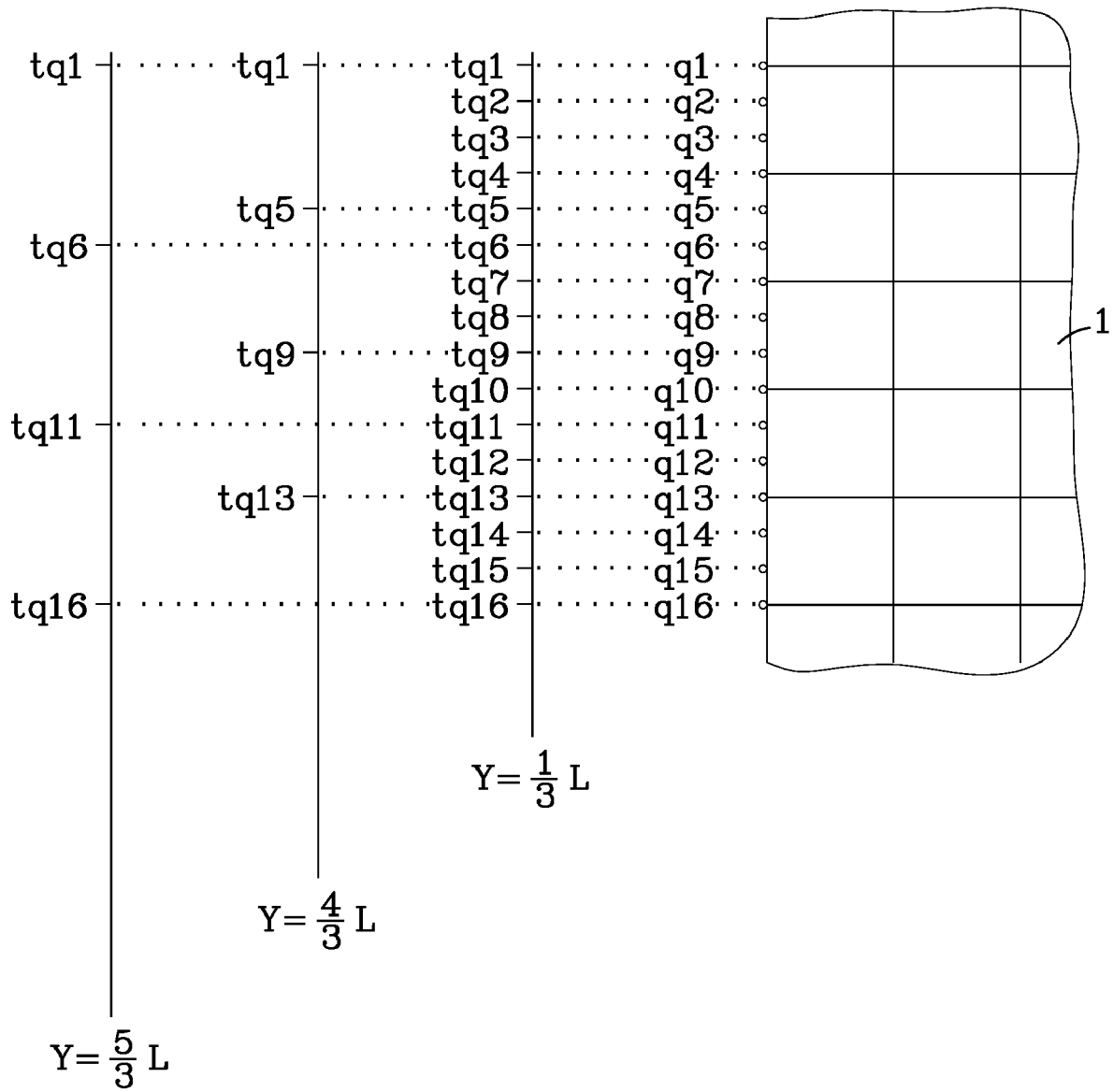
FIG. 13B shows a schematic diagram of a tracing carrier (in analogy to FIG. 4) for tracing partial images taking into account the division of the light-controlling unit according to FIG. 14A for different equidistant y travel distances.

Example 2 as illustrated in FIG. 13A and FIG. 13B): a light-controlling unit with 9×9 light-controlling elements is divided into 3 (m=3) phase areas ST1", ST2", ST3". Each phase area contains three rows of light-controlling elements (FIG. 13A).

Similar to the example in FIG. 4, the division into 3 phase areas gives rise to the smallest possible y travel distance of ⅓ the length L of a side of an image dot B (as well as the smallest possible x deflection distance also of ⅓ the length of a side of an image dot).

FIG. 15 shows a schematic diagram of a tracing carrier (similar to FIG. 4) with a position network grid for tracing partial images according to FIG. 13A for different y travel distances which are equidistant in each case (y=1/3 L; 4/3 L and 5/3 L where L is the length of the side of an image dot).

Similar to FIG. 4, partial images could be traced at moments tq1, tq2, tq3, tq4, tq5, tq6, tq7 . . . where the tracing carrier travels the smallest possible y distance (=⅓ the length of the side of an image dot) between two successive moments of exposure. When the partial images (not shown) are traced on the tracing carrier, these are aligned to the positions q1, q2, q3, q4 similar to FIG. 4. For equidistant y travel distances of ⅓ L each, the exposure moments tq1, tq2, tq3, tq4 . . . lie on the "time line" for ⅓ L.

The calculation of the values for examples 2 and 1 is summarised below, where:

y travel distance=side length L of an image dot+k: m k=1, 2, 3, . . . (m-1); k is an integral number and runs to max. (m-1)

m=2, 3, 4, 5 . . . ; m is an integral number and is equivalent to the number of strip areas Exceptions are y travel distances written in unreduced numerator/denominator form, where numerator and denominator have a common divisor.

Example 2 m=3 m is an integral number and is equivalent to the number of strip areas k=1, 2; k is an integral number and runs from 1 to max. (m-1)=(3-1)=2.

For k=1, y travel distance=1×side length L of an image dot+⅓ the side length L of an image dot =3/3 side length L of an image dot+⅓ the side length L of an image dot =4/3 the side length L of an image dot For k=2, y travel distance=2×side length L of an image dot+⅔ the side length L of an image dot =3/3 side length L of an image dot+⅔ the side length L of an image dot =5/3 side length L of an image dot.

Example 1 m=4 m is an integral number and is equivalent to the number of strip areas k=1; 2; 3: k is an integral number and runs from 1 to max. (m-1)=(4-1)=3

For k=1, y travel distance=1×side length L of an image dot+¼ the side length L of an image dot =4/4 side length L of an image dot+¼ the side length L of an image dot =5/4 side length L of an image dot.

For k=2, y travel distance=1×side length L of an image dot+2/4 the side length L of an image dot =4/4 side length L of an image dot+2/4 the side length L of an image dot =6/4 side length L of an image dot is eliminated because 6/4 can be reduced (to 3/2) and because in 6/4, numerator and denominator have a common divisor.

For k=3, y travel distance=1×side length L of an image dot+¾ the side length L of an image dot =4/4 side length L of an image dot+¾ the side length L of an image dot =7/4 side length L of an image dot.

In the above examples 1 and 2, the length L of the side of an image dot is L<y travel distance <2L. According to the invention however, the y travel distance can also be greater than twice the side length (2L) of an image dot: twice the side length (2L) of an image dot<y travel distance.

It is calculated as follows: y travel distance=u×side length of an image dot+d/m u=1; 2; 3; . . . (m-1) integral m=number of strip areas=2; 3; 4; . . .

Exceptions are y travel distances, written in unreduced numerator/denominator form, where numerator and denominator have a common divisor.

For all permissible y travel distances a) y travel distance<the length L of a side of an image dot;

b) Length of a side of an image dot L<y travel distance<2L c) y travel distance>twice the length L of a side of an image dot, the overall image is formed by the superimposition of overlapping partial images.

For the overall image, the resolution is retained for cases b and c if a greater y travel distance is selected.

With smaller y travel distances (a) parts of the image may be exposed several times. With greater y travel distances (b), (c), any inadequate exposure (through absence of multiple exposure) can be compensated by using stronger sources of light.

All permissible y travel distances (a), (b) and (c) have in common that they are fractions of the side length of an image dot.

The lateral x deflection of the light beams also takes place with greater y travel distances (as in (b) and (c)) according to the same principle as described for FIG. 4. Expressed in a general way, the process according to invention is characterised by the following invention-specific steps:

a) For each moment of exposure (t1, t2, t3, t4, . . . ) the tracing carrier (1) travels in direction y with reference to the light-controlling unit (or vice-versa) by successive equal y distances. The amount of the y travel distance is always a fraction of the side length L of a side of an image dot.

b) In a partial image (T1, T2, T3, . . . ) certain image dots are traced with an optical shift of x deflection (taking into account the following process steps c), d) and e)) with reference to imaginary undeflected image dots, where the x deflection is smaller than the length of side (p) of an image dot (P). The amount of the x deflection distance is: dx or (i) dx=i multiplied by dx, where dx=(1/m) p=(1/m) multiplied by p for m=2, 3, 4 . . . integral, or where (i)dx=(i) multiplied by dx is an integral multiple of dx for i=1, 2, 3, . . . (m-1).

c) The light-controlling elements of the light-controlling unit (4) are assigned to imaginary horizontal strip areas (ST1, ST2, ST3, . . . ) arranged beneath one another. Each strip area (ST1, ST2, ST3 . . . ) contains the same number of light-controlling elements and the same number of rows of light-controlling elements.

The number of strip areas may be 2, 3, 4 or 5. (Note: a 2×2 light-controlling unit can only be divided into 2 strip areas; a 4×4 light-controlling unit either into 2 (in this case m=2) or 4 (in this case m=2) strip areas; a 6×6 light-controlling unit into 2 (in this case m=2) or 3 (in this case m=3) strip areas; an 8×8 light-controlling unit into 2 or 4 strip areas; a 10×10 light-controlling unit into 2 or 5 strip areas; a 12×12 light-controlling unit into 2 or 4 strip areas etc. etc.

d) In the first upper strip area ST1 in the light-controlling unit the light-controlling elements are activated for the image dots to be traced without deflection in the x direction.

In the second strip area ST2 under the first strip area ST1 the light-controlling elements are activated for the image dots to be traced in the x direction which are deflected by the x deflection distance=1×dx.

In the third strip area ST3 (if provided) under the second strip area ST2 the light-controlling elements are activated for the image dots to be traced in the x direction which are deflected by the x deflection distance=2×dx.

In the fourth strip area ST4 (if provided) under the third strip area ST3 the light-controlling elements are activated for the image dots to be traced in the x direction which are deflected by the x deflection distance=3×dx . . . etc.

The x deflection distance increases from strip area to strip area (ST1/ST2, ST2/ST3, ST3/ST4, . . . ) by 1×dx in each case.

e) The beams of light emitted by the light-controlling elements in a strip area of the light-controlling matrix for tracing deflected image dots in x direction are deflected jointly.

The size of the y travel distance (dy) may be equivalent to fractions of the length L of an image dot, where dy=(1/s) L=(1/s) multiplied by L for an integral number s=2, 3, 4 . . .

However, the size of the y travel distance is based on the equation; y travel distance=u×side length L of an image dot+ k/m u=1; 2; 3; . . . k=1; 2; 3; . . . (m-1) integral m=number of strip areas=2; 3; 4; . . .

Exceptions are y travel distances written in unreduced numerator/denominator form where numerator and denominator have a common divisor.

The y travel distance dy and the x deflection distance dx may be different in size. However, the image resolution is only the same in x and y directions when the two values are equal.

Expressed in a general way, the arrangement according to invention is characterised by the following invention-specific features:

the y travel distance is a value which includes a fraction of the length (L) of the side of an image dot (R), an arrangement (6*) for deflecting the beams of light generating the image dots in x direction is located between the light-controlling unit (4*) and the tracing carrier (1*);

where the x deflection distance is equal to a fraction of the length (L) of the side of an image dot and the maximum size of an x deflection distance is smaller than the length (L) of the side of an image dot.

As a light unit, the use of an LED unit (unit with light-emitting diodes) for pulsed light is preferred.

FIG. 15 shows a schematic diagram of a tracing carrier with image tracing arranged in column form.

The image (IM) to be traced extends over several adjacent columns Sp1, Sp2, Sp3, Sp4 of the image surface.

The image is traced in columns. The exposure surface in the exposure station has the same width b as a strip. The tracing carrier is moved in direction y with reference to the light-controlling unit (not shown). According to the invention, the partial images are partially superimposed when the image is being traced in one column.

After the image is traced in one column, the travel unit on which the tracing carrier is located, is moved back and shifted sideways by the width of a column. The tracing of the image in the next column then begins. FIG. 15 shows the current status of an image-tracing operation IM which has already taken place for the strips Sp1, Sp2 and part of strip Sp3.

The tracing of partial images which partially overlap one another causes an improved homogeneity in image quality (tracing intensity) of the individual image dots at the dot grid positions in the movement direction y of the tracing carrier.

However, perpendicularly to this direction of movement there may be differences in the homogeneity of tracing intensity.

FIG. 16 is a diagram of the function of the tracing intensity z for image dots with reference to their position at right angles to the direction of movement y of the tracing carrier i.e. over the width b of a partial image. This function may take the form similar to a Gaussian curve; the intensity of the tracing is greater in the centre of the partial image than at its lateral edges.

To reduce such differences (perpendicularly to direction y), they are first measured as a function of location.

Taking these differences into account, and in order to reduce them, the light-controlling elements in the light-controlling unit can be computer-controlled in such a way that light-controlling elements (for image dots of originally excessive intensity) in the partial images can be deactivated.

Alternatively, an optical filter (not shown) to reduce these differences may also be arranged between the light-controlling unit and the tracing carrier.

Another means of reducing these differences is to trace the images in columns with the image columns overlapping towards their edges.

FIG. 17 shows a schematic diagram of two columns Sp1* and SP2* for tracing images overlapping one another towards their edges where each column shows a pattern G1*, G2* of tracing intensity in the image dots (according to FIG. 16) similar to a Gaussian curve. To trace the image in the overlap area w*, the tracing in column SP1* overlaps with that in column SP2.

The tracing in column SP1* is carried out on the basis of curve G1*, and that in column SP2* on the basis of curve G2*. Thus, for an image dot to be traced in overlap area w* the intensity achieved is the result of adding the ordinate values of curves G1* and G2* (dotted image a*).

The movement of the tracing carrier with reference to the light-controlling unit or of the light-controlling unit with reference to the tracing carrier can take place in a start and stop manner. The conversion of the control pattern of the light-controlling unit into controllable light beams for tracing images can take place in various ways, e.g.

a) via a semiconductor chip with tilting-mirror elements which are struck by pulsed light, b) via a matrix with controllable light-valve elements which are struck by pulsed light, c) via a matrix of elements emitting pulsed light.

According to the invention, the exposure of the tracing carrier to pulsed light of equal or virtually equal energy causes images of continuous depth to be traced, i.e. the exposed areas penetrate the entire thickness of the light-sensitive layer and are removed by the etching operation following exposure.

However, according to the invention it is also possible to generate images with varied depth of tracing. To do this, the image is traced during several passes of the tracing carrier through the exposure station. At each pass, the tracing carrier is exposed to flashes of pulsed light of equal or virtually equal energy. However, the energy of the flash varies from one pass to another. At each pass, the travel device has to be started from the same position in direction y.

In this way, the invention makes it possible to generate three-dimensional structures in the photosensitive layer. Such structures can be used as optical elements for optical or phase focussing, e.g. as a lens or lens field for the optical focussing of light or phase-focussing of light, e.g. in so-called Fresnel diffraction grids.

The process of focussing light by using a Fresnel diffraction grid based on the Huygens principle is well known. Such diffraction grids are described as so-called Fresnel zone plates in the publication "OPTICS", Hecht & Zajac 1974 by the Addison-Wesley Publication Company. Such a lightwavelength specific diffraction grid is formed by applying flat concentric rings of chromium or photographic emulsion to a translucent carrier material. The diffraction grid causes impinging light to be guided through the (round) opening at the centre of the grid.

The portion of the light striking the rings is normally lost through reflection unless the rings are made of a material which causes a shift in phase of the impinging light by half a wave length. (See above source, page 376 "phase-reversal zone plate"). In this case, the portion of the light striking the rings is also guided through the opening. According to the state of the art, Fresnel diffraction grids are used in a number of fields (e.g. telecommunications, laser focussing). These diffraction grids may not necessarily be circular in shape. They may also be elliptical to allow correction of optical distortions in the lens systems being used. (Compensation of the angle of incidence of non-collimated light).

The invention can be realised by using monochromatic light in the ultra-violet range or non-monochromatic light the main portion of which lies in the ultra-violet range. UV-light compatible semiconductor chips with tilting-mirror elements (e.g. "UV-DLP" (digital light processing) produced by Texas Instruments, USA) and UV-light sensitive tracing carriers (e.g. "LDI 330 Resist" produced by Dupont, USA) are readily available on the market.

According to the invention, it is possible to make photographic patterns for printed circuit boards. Preferably however, the invention permits the direct exposure of circuit-board material coated with a photosensitive layer, the circuit-board material consisting of an electrically conductive metallic layer and a non-conductive carrier layer.

With direct exposure of this kind, the photographic pattern is no longer required, the circuit board being exposed directly to light without the insertion of a photographic pattern.

The invention can be used to make printing forms for the letterpress, rotogravure, flatbed, screen and silk-screen printing processes.

According to the invention, in cases where the width of an image exceeds the width b of the exposure station, the image can be traced by several passes of the tracing carrier through the exposure station. One "image column" of the imaginary overall image is generated at each pass. For such a case, the travel device must be capable of moving not only in direction y, but also vertically to it.

Thus, the invention can be used for various processes involving the tracing of a grid image on a photosensitive tracing carrier.

Applications may also be possible where the photosensitive tracing carrier does not consist of a chemically based material, but of a material which charges electrically when exposed, thereby attracting or repelling printing toners which are sensitive to electrical charges.

The moving device may be driven by a stepping motor, a linear-induction motor or a piezoelectric-crystal device or a combination of these.

The grid image T to be traced (overall image) is traced dot by dot by computer control as a succession of partial images (T1, T2, T3, T4 . . . ) on a tracing carrier (1) passing through an exposure station in direction y. All the image dots of a partial image are traced simultaneously. The partial images are traced at moments of flash (t1, t2, t3, t4 . . . ) at each of which the tracing carrier (1) has moved an equal y distance in y direction. The length of the y travel distance always includes a fraction of the length of the side of an image dot. It is smaller or greater than the length of the side of an image dot. When the light-controlling unit is exposed to the light, the light beams emitted by the light-controlling elements cause the light dots to be traced (according to the control pattern in combination with an optical deflection unit) either undeflected or deflected in direction x. Through the superimposition of image dots which overlap one another, small image elements (smaller than image dots) are produced, of which the grid image appears assembled. This results in a higher resolution of the traced grid image. The invention serves particularly for the manufacture of photographic patterns with maximum resolution for printed circuit boards, for the direct exposure of circuit-board material etc. as well as the production of three-dimensional structures for optical elements.

Those skilled in the art will readily recognize that the invention has been set forth by way of examples and that changes to the invention may be made without departing from the spirit and the scope of the appended claims.

The invention claimed is:

1. Process for tracing a computer-stored grid image on a flat photosensitive carrier, where the grid image consisting of grid dots is generated in x/y coordinate alignment by exposure of a light-controlling unit receiving control patterns from a computer program, the light-controlling unit consisting of light-controlling elements arranged in a matrix to which grid dot positions of the grid image are assigned, a controlled beam of light for tracing an image dot on the tracing carrier is guided by each light-controlling element to a position assigned to it on a tracing surface in an exposure station, the tracing carrier moves with reference to the light-controlling unit (or vice versa) with the distance remaining constant between the levels at which said tracing carrier and the light-controlling unit lie, said tracing carrier executes a continuous or gradual movement in a straight line in y direction with reference to the light-controlling unit (or vice versa), for every moment of exposure the light-controlling unit is loaded with a control pattern for tracing one partial image derived from this control pattern on the tracing carrier in the exposure station, where all the image dots of a partial image are traced at the same time, where the exposure station always assumes the same position with reference to the light-controlling unit, the exposures take place at the moments at which the tracing carrier has travelled an equal y distance with reference to the light control unit (or vice versa), comprising the steps of:

moving said tracing carrier (1) successively in an equal y distance in y direction with reference to the light control unit (or vice versa), the y distance including a fraction of the length (L) of the side of an image dot (R), for each moment of exposure (t1, t2, t3, t4, . . . ) said tracing carrier (1);

assigning light-controlling elements of the light-controlling unit (4) to imaginary horizontal strip areas (ST1, ST2, ST3, . . . ; STk for k=1 to m and for m=2, 3, 4, . . . ) arranged beneath one another, where each strip area (ST1, ST2, ST3 . . . ) contains the same number of light-controlling elements and the same number of rows of light-controlling elements;

tracing, certain image dots with an optical deflection distance of x in x direction (with reference to imaginary undeflected image dots) where said x deflection distance is smaller than the length of the side (L) of an image dot (R) and the amount dx or (i) times dx=i multiplied by dx, for dx=(1/m) L=(1/m) multiplied by L for an integral number m=2, 3, 4 . . . as a fraction of the length (L) of the side of an image dot (R), or for (i) dx=(i) multiplied by dx as an integral multiple of dx for i=1, 2, 3, . . . (m−1), in partial images (T1, T2, T3);

activating, in the first upper strip area (ST1) in the light-controlling unit, the light-controlling elements for the image dots to be traced without deflection in the x direction;

activating, in the second strip area (ST2) under the first strip area (ST1) the light-controlling elements for the image dots to be traced in the x direction which are deflected by the x deflection distance=1×dx;

activating, in the third strip area (ST3) which may lie under the second strip area (ST2), the light-controlling elements for the image dots to be traced in the x direction which are deflected by the x deflection distance=2×dx;

activating, in the fourth strip area (ST4) which may lie under the third strip area (ST3), the light-controlling elements for the image dots to be traced in the x direction which are deflected by the x deflection distance=3×dx . . . etc;

increasing said x deflection distance for said image dots traced from strip area to strip area (ST1/ST2, ST2/ST3, ST3/ST4, . . . ) by 1×dx in each case; and, deflecting, together, beams of light emitted by the light-controlling elements in a strip area of the light-controlling matrix for tracing deflected image dots in the x direction.

2. Process according to claim 1, wherein said y travel distance (dy) is of a size corresponding to fractions of the length L of an image dot, where dy=(1/s)L=(1/s) multiplied by L for s=2, 3, 4, . . . integral.

3. Process according to claim 1, wherein said y travel distance is of a size corresponding to the equation: y travel distance=u×side length L of an image dot+k/m where u=1; 2; 3; . . . and k=1; 2; 3; . . . (m−1) where an integral m=number of strip areas=2; 3; 4; . . . exceptions being y travel distances, which, when written in unreduced numerator/denominator form, said numerator and denominator have a common divisor.

4. Process according to claim 1, wherein said y travel distance is equal to the smallest x deflection distance.

5. Process according to claim 1, wherein said light-controlling unit (4) is struck by pulsed light emitted by an LED unit (unit with light-emitting diodes).

6. Process according to claim 1, wherein said conversion of said computer grid image into controlled beams of light for tracing an image takes place by means of a semiconductor chip with tilting-mirror elements which is struck by pulsed light.

7. Process according to claim 1, wherein said conversion of said computer grid image into controlled beams of light for tracing an image takes place via a matrix of controlled light valve elements, or said conversion of said computer grid image into controlled beams of light for tracing an image takes place via a matrix of flash-emitting elements.

8. Process according to claim 1, wherein the size of the partial image generated in the exposure station (6) is determined by a scaling lens (7) arranged between said light-controlling unit (4) and said tracing carrier (1).

9. Process according to claim 1, wherein said tracing carrier (1) travels with a continuous or a gradual movement with reference to the light-controlling unit (4).

10. Process according to claim 1, wherein said image is traced with pulsed light of equal or virtually equal flash energy in order to create a constant depth of tracing in said tracing carrier (1).

11. Process according to claim 1, wherein said image is traced in several passes of said tracing carrier (1) through the exposure station (9), where, at each pass, the image is traced by pulsed light of equal or virtually equal energy, but where the energy of the light is different at each pass, in order to achieve varying depths of tracing in the tracing carrier (1).

12. Process according to claim 1, wherein monochromatic light in the ultra-violet range or non-monochromatic light, the main portion of which is in the ultra-violet range, is used as said light source.

13. Process according to claim 1, used to manufacture photographic patterns for printed circuit boards.

14. Process according to claim 1, used to directly expose circuit-board material coated with a photosensitive layer, said circuit-board material consisting of an electrically conductive metallic layer and a non-conductive carrier layer.

15. Process according to claim 1, used for making printing forms for the letterpress, rotogravure, flatbed, screen and silk-screen printing processes.

16. Process according to claim 11, used for creating three-dimensional structures in the photosensitive layer for optical elements for optical phase-focussing.

17. Process according to claim 1, where an image whose width exceeds the width (b) of the exposure station (2) is traced in several passes of the tracing carrier (1) through the exposure station (6), where a column (Sp1, Sp2, Sp3, Sp4 . . . ) of the imaginary overall image (IM) is generated at each pass.

18. Process according to claim 1, wherein in order to reduce measured deviations from a homogeneous tracing depth z in the individual image dots at the grid positions of the tracing carrier (1) (viewed at right angles to the direction of travel y of said tracing carrier):

a) said light-controlling elements (c) are controlled by a computer program in such a way that these deviations are taken into account and that, when tracing partial images, said light-controlling elements for image dots whose tracing intensity was originally too high, are deactivated;

b) a filter to compensate for these deviations is located between said light-controlling unit (4) and said tracing carrier (1);

c) said image is traced in several passes of said tracing carrier (1) through said exposure station (6), where an image column (SP1*, Sp2*) is created at each pass and where adjacent strips of said image partially (w*) overlap one another toward their edges.

19. Apparatus for tracing a computer-stored grid image on a flat photosensitive carrier as a grid image with x/y coordinate alignment consisting of image dots, comprising:

a light-controlling unit (4*);

a travelling unit for moving the tracing carrier in direction y;

a grid image created by the exposure to light;

said light-controlling unit is controlled by control patterns generated by a computer program, said light-controlling unit (4*) consists of light-controlling elements (c*) arranged similar to a matrix;

a dot of light is traced at assigned positions of said grid image by a beam of light guided by said light-controlling element;

said tracing carrier is moved with reference to said light-controlling unit (or vice versa);

said tracing carrier is in a first plane and said light-controlling unit is in a second plane and said first and second planes are spaced apart a constant distance from each other;

said control patterns for said light-controlling unit (4) are loaded for each of said exposure moments (t1, t2, t3 . . . ), partial images (T1, T2, T3, . . . ) are traced in said exposure station according to said control patterns;

said exposure station remains in the same position with reference to said light-controlling unit;

all said image dots of said partial image (T1, T2, T3, T4 . . . ) are traced simultaneously;

said tracing carrier is moved by an equal y distance in y direction between two successive moments of exposure;

a traced partial image (T1) partially overlaps the partial image (T2) traced subsequently, and each partial image traced coincides on said tracing carrier with a part of an imaginary grid image to be trace;

said y travel distance has a value which includes a fraction of the length (L) of a side of an image dot (R), and, an optical deflection unit (6*) deflects said rays of said light generating said light dots in the x direction is located between said light-controlling unit (4*) and said tracing carrier (1*), where the x deflection distance is a fraction of the length (L) of the side of said image dot and the maximum size of an x deflection distance is smaller than the length (L) of the side of an image dot.

20. Apparatus according to claim 19, wherein said light-controlling unit (4*) is divided into several imaginary strip areas (ST1*, ST2*, ST3*, ST4*) arranged beneath one another, said optical deflection unit (6*) comprises optical elements (6-1*, 6-2*, 6-3*, 6-4*) for deflecting the light beams generating said image dots, said optical elements each being assigned to one strip area (ST1*, ST2*, ST3*, ST4*), that all said light beams for tracing image dots emitted by the light-controlling elements of a strip area are deflected together by the same x distance by said optical deflection unit (6-2*, 6-3*, 6-4*), and that the deflection of said individual light beams emitted by the individual strip areas is different in each case.

21. Apparatus according to claim 20, wherein said optical elements (6-2*, 6-3*, 6-4*) are flat glass plates of the same thickness which are arranged at different angles to the plane of said light-controlling unit to achieve different x deflection distances for the light beams passing through them.

22. Apparatus according to claim 20, wherein said optical element is a glass plate (6-1*) arranged flat (not obliquely) is assigned to a strip area (ST1*), said glass plate not causing any x deflection of the light beams passing through it.

23. Apparatus according to claim 19, wherein a lens (7) which controls the scale of the partial image is located between the tracing carrier (1) and the light-controlling unit (4).

24. Apparatus according to claim 19, wherein the device for moving in the y travel direction is controlled by a stepping motor, a linear motor, a piezoelectric-crystal device or a combination of the above devices.

\* \* \* \* \*